United States Patent
Rajagopalan et al.

(10) Patent No.: US 12,098,456 B2
(45) Date of Patent: Sep. 24, 2024

(54) SYSTEMS AND METHODS FOR TAILORED MICROSTRUCTURES USING TEMPLATED GRAIN NUCLEATION

(71) Applicants: Jagannathan Rajagopalan, Tempe, AZ (US); Paul Rasmussen, Tempe, AZ (US)

(72) Inventors: Jagannathan Rajagopalan, Tempe, AZ (US); Paul Rasmussen, Tempe, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 590 days.

(21) Appl. No.: 17/405,194

(22) Filed: Aug. 18, 2021

(65) Prior Publication Data

US 2022/0136092 A1 May 5, 2022

Related U.S. Application Data

(60) Provisional application No. 63/067,623, filed on Aug. 19, 2020.

(51) Int. Cl.
*C23C 14/02* (2006.01)
*C23C 14/58* (2006.01)

(52) U.S. Cl.
CPC ........ *C23C 14/024* (2013.01); *C23C 14/5806* (2013.01)

(58) Field of Classification Search
None
See application file for complete search history.

(56) References Cited

U.S. PATENT DOCUMENTS

| 10,385,440 B2 | 8/2019 | Rajagopalan et al. |
| 10,822,688 B2 | 12/2020 | Rajagopalan et al. |

FOREIGN PATENT DOCUMENTS

| WO | WO-2016077136 A1 * | 5/2016 | ............. C23C 10/04 |

OTHER PUBLICATIONS

Idadi E, Rajagopalan J. Texture dependent strain rate sensitivity of ultrafine-grained aluminum films. Scr Mater. 2016;114:65 6.
Vopsaroiu M, Fernandez GV, Thwaites MJ, et al. Deposition of polycrystalline thin films with controlled grain size. J Phys D Appl Phys. 2005;38:490-496.
Thompson CV. Structure evolution during processing of polycrystalline films. Annu Rev Mater Sci. 2000;30:159-190.
Petrov I, Barna PB, Hultman L, et al.Microstructural evolution during film growth. J Vac Sci Technol A Vac Surf Films. 2003;21:S117.
Buijnsters JG, Celis J-P, Hendrikx RWA, et al. Metallic seed nanolayers for enhanced nucleation of nanocrystalline diamond thin films. J Phys Chem C. 2013;117:23322-23332.
Harp GR, Parkin SSP. Seeded epitaxy of metals by sputter deposition. Appl Phys Lett. 1994;65:3063-3065.
Miller KT, Lange FF. Highly oriented thin films of cubic zirconia on sapphire through grain growth seeding. J MaterRes. 1991;6:2387-2392.
Thompson CV. Grain growth in thin films. Annu Rev Mater Sci. 1990;20:245-268.
Wu X, Jiang P, Chen L, et al. Extraordinary strain hardening by gradient structure. PNAS. 2014;111:7197-7201.
Rajagopalan J, Han JH, Saif MTA. Bauschinger effect in unpassivated freestanding nanoscale metal films. Scr Mater. 2008;59:734-737.
Rajagopalan J, Han JH, Saif MTA. Plastic deformation recovery in freestanding nanocrystalline aluminum and gold thin films. Science. 2007;315:1831-1834.
Lee D, Zhao B, Perim E, et al. Crystallization behavior upon heating and cooling in Cu 50 Zr 50 metallic glass thin films. Acta Mater. 2016;121:68-77.
Greer AL. Crystallization of amorphous alloys. Metall Mater Trans A. 1996;27:549-555.
Easton M, StJohn D. Grain refinement of aluminum alloys: part I. The nucleant and solute paradigms—a review of the iterature. Metall Mater Trans A. 1999;30: 1613-1623.
Mullins WW. The effect of thermal grooving on grain boundary motion. Acta Metall. 1958;6:414-427.
Wong CC, Smith HI, Thompson CV. Surface-energy driven secondary grain growth in thinAu films. Appl Phys Lett. 1986;48:335-337.
Vitos L, Ruban AV, Skriver HL, et al. The surface energy of metals. Surf Sci. 1998;411:186-202.
Yamaguchim, Inui H, Ito K.High-temperature structural intermetallics. Acta Mater. 2000;48:307-322.
Fu Y, Du H, Huang W, et al. TiNi-based thin films in MEMS applications: a review. Sens Actuators A Phys. 2004;112:395-408.
Easton M, St John D. Grain refinement of aluminum alloys: part II. Confirmation of, and a mechanism for, the solute paradigm. Metall Mater Trans A. 1999;30:1625-1633.
Sarkar R, Ebner C, Izadi E, et al. Revealing anelasticity and structural rearrangements in nanoscale metallic glass films using in situ TEM diffraction. Mater Res Lett. 2017;5:135-143.
Chu JP, Lai YW, Lin TN, et al. Deposition and characterization of TiNi-base thin films by sputtering.Mat Sci Eng A. 2000;277:11-17.
Chu JP, Jang JSC, Huang JC, et al. Thin film metallic glasses: unique properties and potential applications. Thin Solid Films. 2012;520:5097-5122.
El Khakani MAE, Chaker M, Jean A, et al. Hardness and Young's modulus of amorphous a-SiC thin films determined by nanoindentation and bulge tests. J Mater Res. 1994;9:96-103.

(Continued)

*Primary Examiner* — Tabatha L Penny
(74) *Attorney, Agent, or Firm* — Snell & Wilmer L.L.P.

(57) ABSTRACT

Methods for controlled microstructure creation utilize seeding of amorphous layers prior to annealing. Seed crystals are formed on an amorphous layer or layers. The material, size, and spacing of the seed crystals may be varied, and multiple seed layers and/or amorphous layers may be utilized. Thereafter, the resulting assembly is annealed to generate a crystalline microstructure. Via use of these methods, devices having desirable microstructural properties are enabled.

13 Claims, 33 Drawing Sheets

(56) References Cited

OTHER PUBLICATIONS

Rincon C, Romero J, Esteve J, et al. Effects of carbon incorporation in tungsten carbide films deposited by r.f. magnetron sputtering: single layers and multilayers. Surf Coat Technol. 2003;163-164:386-391.

Greene LE, Law M, Tan DH, et al. General route to vertical ZnO nanowire arrays using textured ZnO seeds. Nano Lett. 2005;5:1231-1236.

* cited by examiner

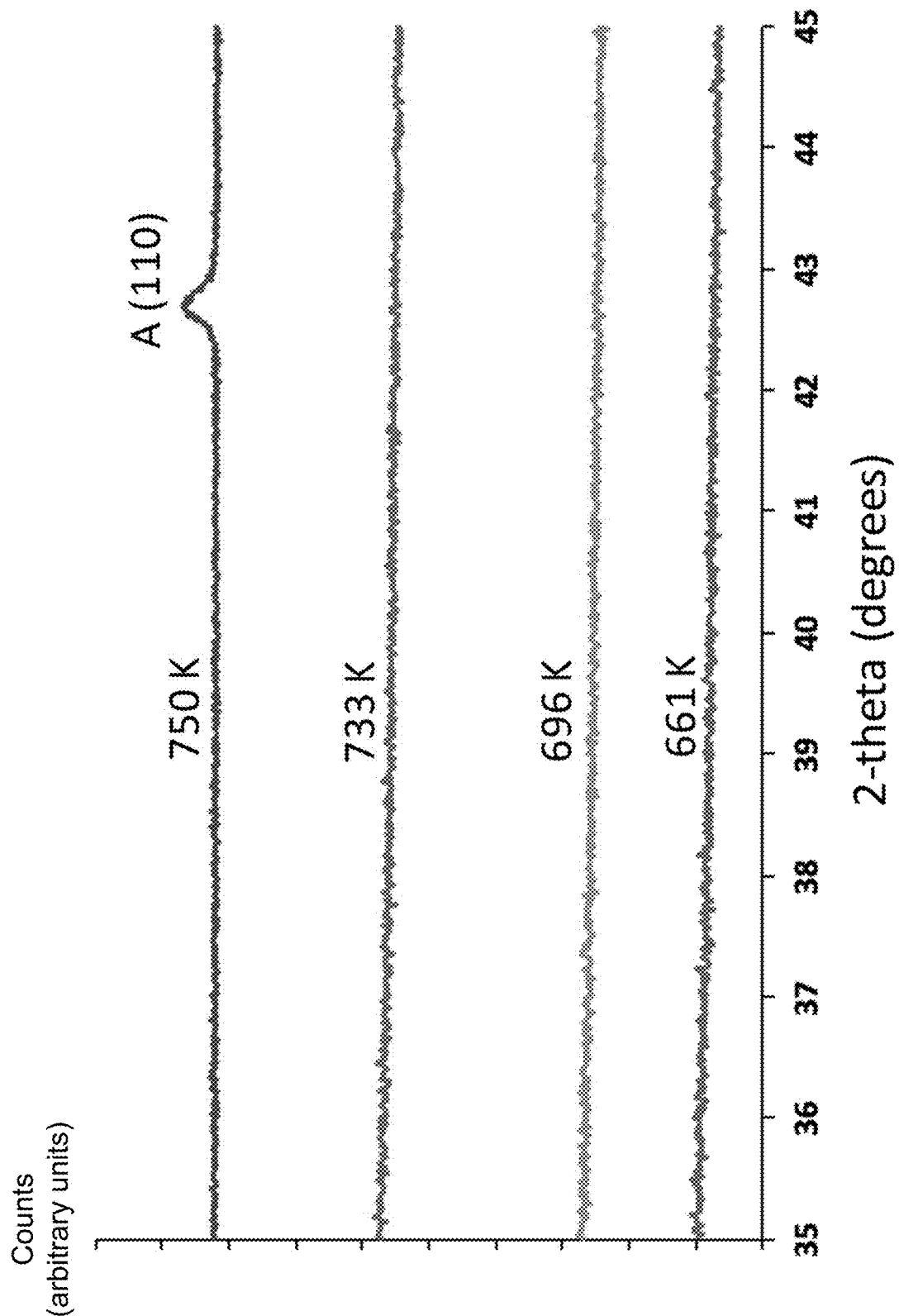

SYSTEMS AND METHODS FOR TAILORED MICROSTRUCTURES USING TEMPLATED GRAIN NUCLEATION

CROSS-REFERENCE TO RELATED APPLICATIONS

This application is a non-provisional of, and claims priority to and the benefit of U.S. Provisional Application No. 63/067,623, entitled "SYSTEMS AND METHODS FOR TAILORED MICROSTRUCTURES USING TEMPLATED GRAIN NUCLEATION," filed on Aug. 19, 2020. The disclosure of the foregoing application is incorporated herein by reference in its entirety, including but not limited to those portions that specifically appear hereinafter, but except for any subject matter disclaimers or disavowals, and except to the extent that the incorporated material is inconsistent with the express disclosure herein, in which case the language in this disclosure shall control.

FEDERALLY SPONSORED RESEARCH OR DEVELOPMENT

This invention was made with government support under 1563027 awarded by the National Science Foundation. The government has certain rights in the invention.

TECHNICAL FIELD

The present disclosure relates to nanomaterials, and in particular to control of nanocrystalline microstructures resulting from the crystallization of amorphous solids.

BACKGROUND

Nanocrystalline metals and alloys often have superior mechanical properties (e.g., high strength, wear resistance, superplastic formability, etc.) compared to coarse-grained materials. Nanocrystalline materials are primarily produced using two different approaches: (i) "top-down" approaches such as severe plastic deformation; or (ii) "bottom-up" approaches like sputtering or electrodeposition. A third, less common, technique to produce nanocrystalline alloys involves the crystallization of a fully amorphous material by controlled thermal annealing or severe mechanical deformation. All of these prior approaches, however, provide only a limited capability to control the microstructure. Accordingly, improved techniques for creating nanocrystalline materials with controlled microstructures are desirable.

SUMMARY

A method for controlled microstructure creation is disclosed herein. The method may comprise: depositing a first layer of a first material in an amorphous form on a substrate; depositing a plurality of seed crystals on the first layer of the first material, the plurality of seed crystals comprising a second material; and annealing the first material and the plurality of seed crystals to form a microstructure.

In various embodiments, the method may further comprise, prior to the annealing, depositing a second layer of the first material to encapsulate the plurality of seed crystals between the first layer of the first material and the second layer of the first material. The method may further comprise depositing a second plurality of seed crystals on the second layer of the first material, the second plurality of seed crystals comprising a third material. The third material may be different from the second material. The method may further comprise depositing a third layer of the first material to encapsulate the second plurality of seed crystals. The depositing the plurality of seed crystals may further comprise controlling at least one condition of the depositing in order to control placement of the plurality of seed crystals on the first layer of the first material, wherein the at least one condition comprises temperature, rate, thickness or a combination thereof. The depositing the plurality of seed crystals may further comprise varying placement and material of the plurality of seed crystals in order to systematically alter at least one characteristic of the microstructure resulting from the annealing. The at least one characteristic of the microstructure may comprise orientation of nucleated grains, grain size, texture, phase composition of nucleated grains, or a combination thereof.

A method of creating a microstructure having predetermined properties is disclosed herein. The method may comprise: determining the microstructure having a desired mean grain size, a desired grain geometry, and a desired spatial distribution of grains; selecting a seed layer material to encapsulate within a first material to form a film, the first material configured to be in an amorphous form prior to an annealing process; determining a film configuration for the film based on the desired mean grain size, the desired grain geometry and the desired spatial distribution of grains; and determining the annealing process including an annealing temperature and an annealing duration to form the microstructure with the predetermined properties.

The method may further comprise selecting a second seed layer material to encapsulate within the first material, the second seed layer material being different from the seed layer material. The method may further comprise forming an amorphous matrix comprising the first material and the seed layer material encapsulated therein. The method may further comprise annealing the amorphous matrix in accordance with the annealing process. The method may further comprise determining at least one of a deposition temperature for the seed layer material, a rate of deposition for the seed layer material, or a thickness of the seed layer material based on at least one of the desired mean grain size, the desired grain geometry and the desired spatial distribution of grains. The method may further comprise alternating between depositing the first material and depositing the seed layer material until a desired film thickness is achieved.

A method of forming a tailored crystallized microstructure is disclosed herein. The method may comprise: forming an amorphous matrix comprising a first material and a plurality of seed crystals disposed within the first material; annealing the amorphous matrix at a temperature, the temperature being less than a crystallization temperature for the first material; and in response to annealing the amorphous matrix at the temperature, forming the tailored crystallized microstructure.

In various embodiments, the plurality of seed crystals include a first set of seed crystals having a second material and a second set of seed crystals comprising a third material, the third material being different than the second material. Forming the amorphous matrix may comprise alternating between depositing the first material and depositing the plurality of seed crystals until a desired film thickness is achieved. The depositing the plurality of seed crystals may further comprise varying placement and material of the plurality of seed crystals in order to systematically alter at least one characteristic of the microstructure resulting from the annealing. The at least one characteristic of the microstructure may comprise orientation of nucleated grains, grain size, texture, phase composition of nucleated grains, or a combination thereof. A device may be manufactured in accordance with the methods disclosed herein.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the following illustrative figures. In the following figures, like reference numbers refer to similar elements and steps throughout the figures.

FIG. 4A shows the film after heating at 550° C. for 1 hour, whereas FIG. 4B corresponds to the film after heating at 650° C. for a further 30 minutes;

FIG. 4C corresponds to 600° C. annealing for 1 hour and shows the nucleation of a large crystalline phase (arrow) as revealed by the SAD pattern. The rest of the film (arrow) was still amorphous. FIG. 4D corresponds to further annealing at 650° C. for 30 minutes and shows the formation of μm-sized grains;

FIGS. 5A, 5B, 5C, and 5D illustrate room temperature XRD data for amorphous NiTi films, with and without encapsulated seed layers, annealed at the indicated temperatures, in accordance with various embodiments;

DETAILED DESCRIPTION

Figure 1:
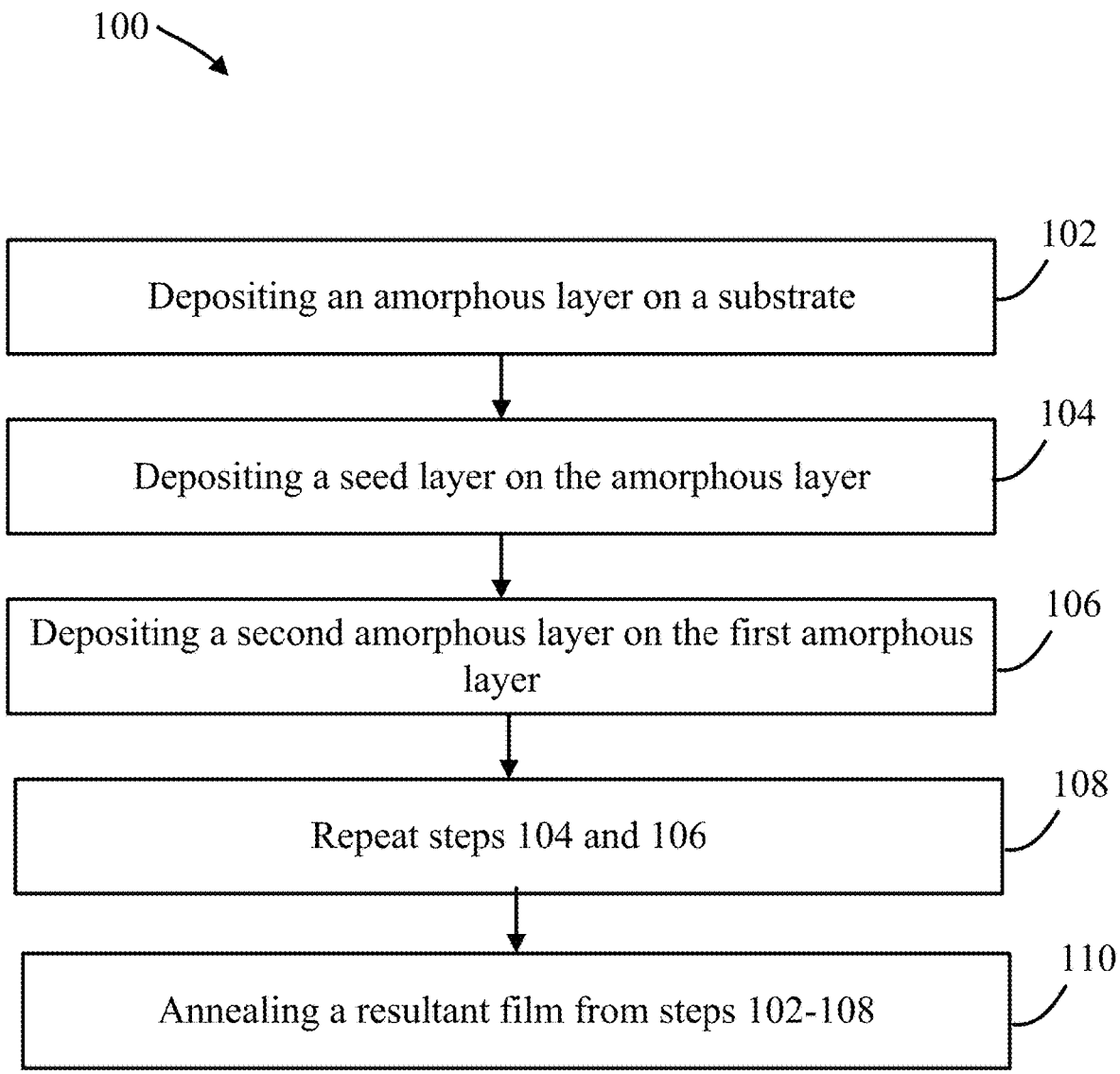
FIG. 1 illustrates a method for controlled microstructure creation, in accordance with various embodiments.

The detailed description of exemplary embodiments herein makes reference to the accompanying drawings, which show exemplary embodiments by way of illustration. While these exemplary embodiments are described in sufficient detail to enable those skilled in the art to practice the principles of the present disclosure, it should be understood that other embodiments may be realized and that logical changes and adaptations in design and construction may be made in accordance with principles of the present disclosure. Thus, the detailed description herein is presented for purposes of illustration only and not of limitation. For example, steps recited in any of the method or process descriptions may be executed in any suitable order and are not necessarily limited to the order presented. Furthermore, any reference to singular includes plural embodiments, and any reference to more than one component or step may include a singular embodiment or step.

For the sake of brevity, conventional techniques for materials deposition, thermal processing, microstructure creation, crystalline engineering, and/or the like may not be described in detail herein. Furthermore, the connecting lines shown in various figures contained herein are intended to represent exemplary functional relationships and/or physical couplings between various elements. It should be noted that many alternative or additional functional relationships or physical connections may be present in a practical method for controlled microstructure creation or in materials or devices resulting therefrom.

As referred to herein, "crystallization temperature" refers to a temperature at which crystallization begins by which a solid forms, where atoms or molecules become highly organized into a structure known as a crystal.

As used herein, the term "film" refers to material that is deposited onto a surface of a substrate. A film can be continuous or discontinuous.

As used herein, a "substrate" refers to any material having a surface onto which material can be deposited. A substrate can include a bulk material, such as silicon (e.g., single crystal silicon), and may include one or more layers overlying the bulk material. Exemplary materials suitable for use as a substrate include silicon, germanium, silicon germanium, quartz, zinc oxide, and rock salt (NaCl). By way of particular example, a substrate can be or include (111) or (100)-oriented single crystal silicon substrates—e.g., wafers.

Nanocrystalline materials are primarily produced using two different approaches. "Top-down" approaches start with materials with larger crystals (grains) and then refine/break down the larger crystals (grains) down into nano-scaled materials (e.g., severe plastic deformation). "Bottom-up" approaches start with individual atoms/nanoparticles and then subsequently compact and/or assemble the atoms/nanoparticles into nano-scaled materials (e.g., sputtering or electrodeposition). A third, less common, technique to produce nanocrystalline alloys involves the crystallization of a fully amorphous material by controlled thermal annealing or severe mechanical deformation.

All of these prior approaches, however, provide only a limited capability to control the microstructure. Depending on the use and/or purpose for the resulting nanocrystalline metal or alloy, it may be desirable to have greater control over the microstructure in order to change and control its properties. Accordingly, improved techniques for creating nanocrystalline materials with controlled microstructures are desirable.

These and other deficiencies of prior approaches to producing nanocrystalline materials may be addressed via application of principles of the present disclosure. In various exemplary embodiments, a microstructure may be engineered via the controlled crystallization of amorphous alloys in connection with tuning the density and/or distribution of grain nucleation sites. The density and distribution may be controlled, for example, by systematically seeding nanocrystallites in an amorphous matrix in situ. Moreover, the cross-sectional microstructure and aspect ratio (height/diameter) of grains may be controlled, for example, by changing the number and distribution of crystalline seed layers.

Principles of the present disclosure enable creation of materials wherein the three-dimensional microstructure is controllable and/or tailorable to a desired set of parameters (e.g., grain size, material phase, etc.). Moreover, application of principles of the present disclosure may be directly applied to produce coatings having high strength, toughness, and oxidation/corrosion resistance, for example for uses in high-temperature structural applications. Additionally, methods disclosed herein may be extended to industrial scale processes, such as electrodeposition, enabling full three-dimensional microstructural control of bulk nanocrystalline alloys.

Utilization of principles of the present disclosure can enable significant improvements in the mechanical, thermal, and chemical properties of various materials. Additionally, the performance and operational lifetime of various industrial and/or military components may be enhanced. For example, microstructured and/or nanostructured materials as contemplated herein may be utilized to prevent oxidation and/or corrosion of high-temperature structural alloys used in aircraft engine compressor blades and casings, automobile turbochargers, steam turbine blades, power plant boiler tubing, and/or the like. Additionally, fabrication techniques disclosed herein may be applied to form low-pressure turbine blades and other plate-like structures.

Metallic films have a broad range of applications in electronics, optoelectronics, plasmonics, catalysis and MEMS sensors and actuators. In many of these applications it is highly desirable to control the microstructure (size and spatial distribution of grains, texture and phase composition) of the films since the microstructure largely governs their mechanical and physical properties. For instance, large grain sizes are desired in electronic interconnects to reduce electrical resistivity and electromigration. In shape memory thin films like Nickel-Titanium alloys (or "Nitinol"), a particular phase (austenite or martensite) may be required depending on the application. It is also often necessary to reduce the processing temperature (deposition or post-deposition annealing) of the metallic films to make them compatible with the fabrication methods of the devices into which they are incorporated. For example, when Nitinol films are employed for MEMS sensor/actuator applications, their deposition/annealing temperatures need to be kept low to maintain compatibility with the microfabrication processes used to produce the MEMS devices. Similarly, when Nitinol films are deposited on polymeric substrates, the processing temperatures are limited because the structure and properties of polymers degrade at elevated temperatures. Thus, systems and methods that enable precise control of the microstructures of thin films while reducing processing temperatures could be immensely beneficial.

The present disclosure concerns systems and methods for synthesis of thin films with highly controlled grain size, texture and phase composition to tailor their mechanical and physical properties. In addition, the present disclosure concerns systems and methods for low temperature synthesis of thin films with tailored grain size, texture and phase composition. Furthermore, the disclosed systems and methods allow us to spatially vary these parameters (grain size, texture, phase composition) as desired. The methods involve embedding a large number of seed crystals of specific materials and orientations into an amorphous precursor film, which is then crystallized by controlled thermal annealing. By choosing the seed crystals appropriately, the crystallization temperature is considerably reduced.

The present disclosure concerns systems and methods for synthesis of thin films with highly controlled grain size, texture and phase composition using physical vapor deposition. The methods allow precise tailoring of thin film microstructures to systematically tune their mechanical and physical properties. The methods are applicable to a wide range of materials including metallic alloys, ceramics and semiconductors. The thin films fabricated using these methods have applications in photovoltaics, MEMS sensors and actuators, thermal barrier systems, wear and corrosion resistant coatings, diffusion barriers/insulators in electronics, transparent electrodes in optoelectronics and optical coatings.

At least two novel aspects distinguish the systems and methods in the present disclosure from existing technologies. First, the disclosed systems and methods use a unique seeding technique to embed a large number of nanocrystals into an amorphous matrix, which then control the grain nucleation in the amorphous film upon annealing. Second, by appropriately choosing the seed material(s) and deposition conditions, both the microstructural parameters as well as the crystallization temperature can be systematically varied.

There are a number of advantages of the systems and methods in the present disclosure over existing technologies. The disclosed systems and methods are applicable to a broad range of materials including metallic alloys (ordered intermetallics, high entropy alloys, etc), semiconductors and ceramics (oxides, nitrides, etc.). The processing temperatures of the disclosed systems and methods are relatively low (0.5 times the melting temperature or even lower). The disclosed systems and methods can be used to precisely control key microstructural parameters such as grain size and size distribution, orientation and phase composition. More importantly, the disclosed systems and methods allow spatial variation of these microstructural parameters as desired.

The thin films fabricated using the disclosed systems and methods have applications in photovoltaics, MEMS sensors and actuators, thermal barrier systems, wear and corrosion resistant coatings, diffusion barriers/insulators in electronics, transparent electrodes in optoelectronics and optical coatings.

Figure 2A:
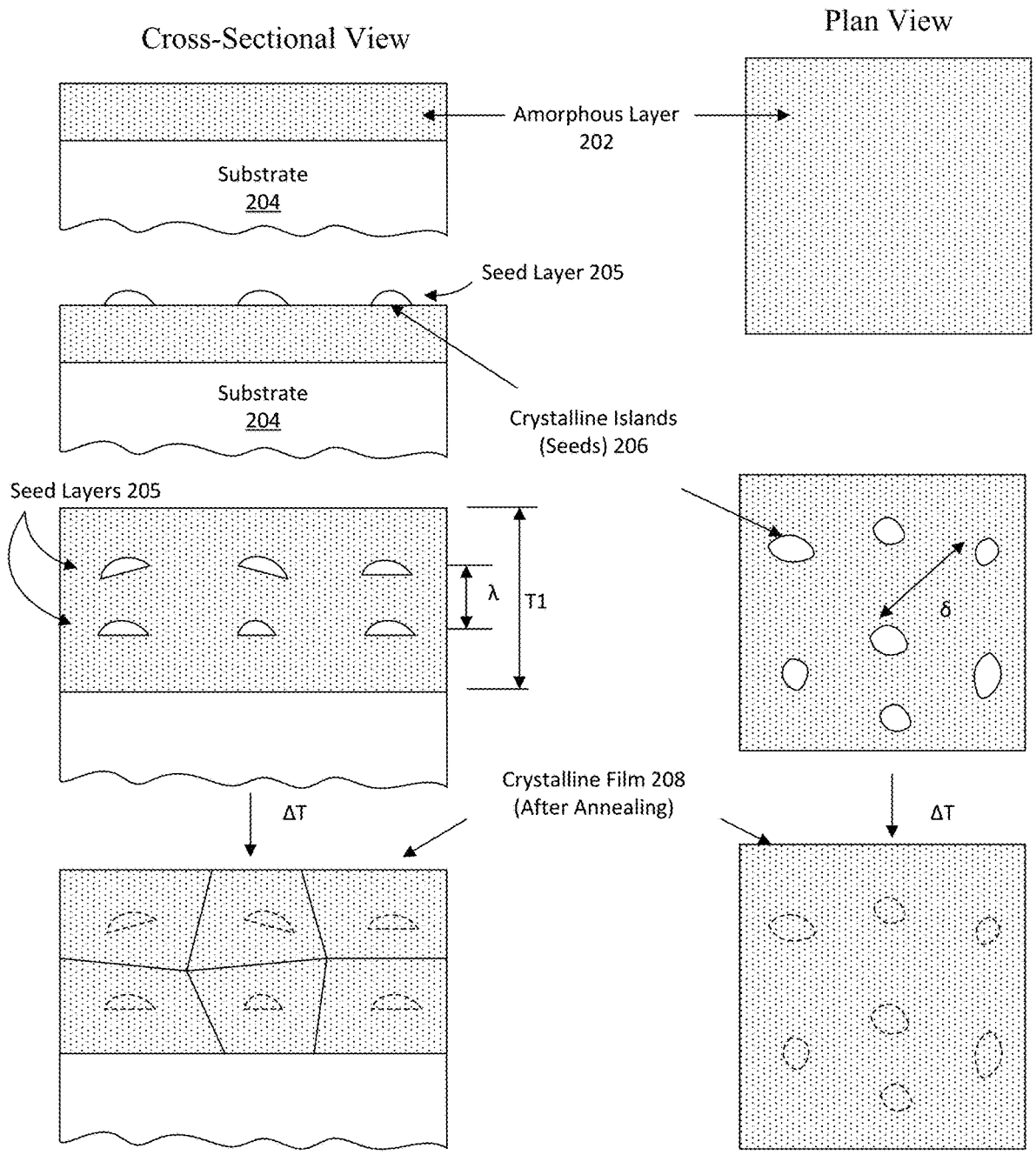
FIG. 2A illustrates a schematic of the synthesis process for controlled microstructure according to various exemplary embodiments.

Referring now to FIGS. 1 and 2A, a method 100 for controlled microstructure creation is illustrated, in accordance with various embodiments. In various embodiments, principles of the method 100 contemplate a thin film synthesis process comprising of the following steps. The method 100 comprises depositing an amorphous layer 202 on a substrate 204 (step 102). In various embodiments, the amorphous layer 202 is deposited on the substrate 204 by physical vapor deposition at room temperature (RT). In various embodiments, the amorphous layer 202 comprises Titanium-Aluminum (TiAl) and Nitinol. In this regard, step 102 may include co-depositing TiAl and Nitinol to form the amorphous layer 202 on the substrate 204. Although described herein with respect to TiAl and Nitinol for the amorphous layer 202, the present disclosure is not limited in this regard. For example, method 100 may be applied to any other amorphously grown material and enable a synthesis of thin films/coatings with a tailored microstructure, in accordance with various embodiments.

In various embodiments, the amorphous layer deposited via step 102 is relatively thick (e.g., between 20-500 nm). In various embodiments, the substrate 204 may be approximately 200 μm-thick Si (100) wafers with a 60 nm thick SiNx diffusion barrier layer (grown by plasma enhanced chemical vapor deposition). Although described herein with respect to various sizes for the amorphous layer 202 and the substrate 204, the present disclosure is not limited in this regard. For example, one skilled in the art may recognize various applications of with different size substrate 204 or amorphous layer 202 and be within the scope of this disclosure.

In various embodiments, the method 100 further comprises a depositing a seed layer 205 with a crystalline structure on the amorphous layer (step 104). Depositing the seed layer may be performed at room temperature. In various embodiments, the seed layer 205 is very thin (less than 5 nm thick) and has a high interfacial energy with the amorphous layer 202 so that it forms crystalline islands (seeds) 206 on the amorphous layer 202. In various embodiments, a material of each seed in the seed layer 205 comprises pure titanium or pure aluminum. The seed layer may be very thin, non-contiguous and configured to result in the formation of isolated crystalline seeds 206 as illustrated in FIG. 2A.

The method 100 further comprises depositing a second amorphous layer on the first amorphous layer 202 (step 106). The second amorphous layer is in accordance with the first amorphous layer 202 (e.g., TiAl and Nitonal). Step 106 may result in the seeds 206 formed from step 104 being encapsulated by the amorphous layers 202 from steps 102 and 106.

In various embodiments, the method 100 further comprises repeating steps 104 and 106 until the desired film thickness Ti is reached. Distance X is the spacing between seed layers 205 along the film thickness Ti. The thickness of the amorphous layers 202 generated from step 106 can be varied across the film 208 so that the distance k between the seed layers 205 is not constant. Similarly, an average in-plane spacing (δ) between the seeds in a seed layer 205 can be controlled by varying a seed layer thickness, a deposition rate, and/or a temperature during the seed layer 205 depositing step (step 104). Material for seeds in each seed layer 205 can be changed from layer to layer or be the same from layer to layer. The present disclosure is not limited in this regard.

The method 100 further comprises annealing a resultant film formed from steps 102-108 at an elevated temperature within a vacuum (step 110). In this regard the resultant film from steps 102-108 is crystallized (i.e., formed into crystals), in accordance with various embodiments. In various embodiments, the seeds of each seed layer 205 serve as preferential grain nucleation sites during annealing and hence the grain heights and diameters scale with λ and δ, respectively. Since both λ and δ can be independently varied during each step of the growth process for method 100, the size, dispersion and spatial distribution of grains can be explicitly controlled. By changing the orientation and material of the seed crystals, the orientation and phase composition of the nucleated grains can be systematically varied.

Figure 2B:
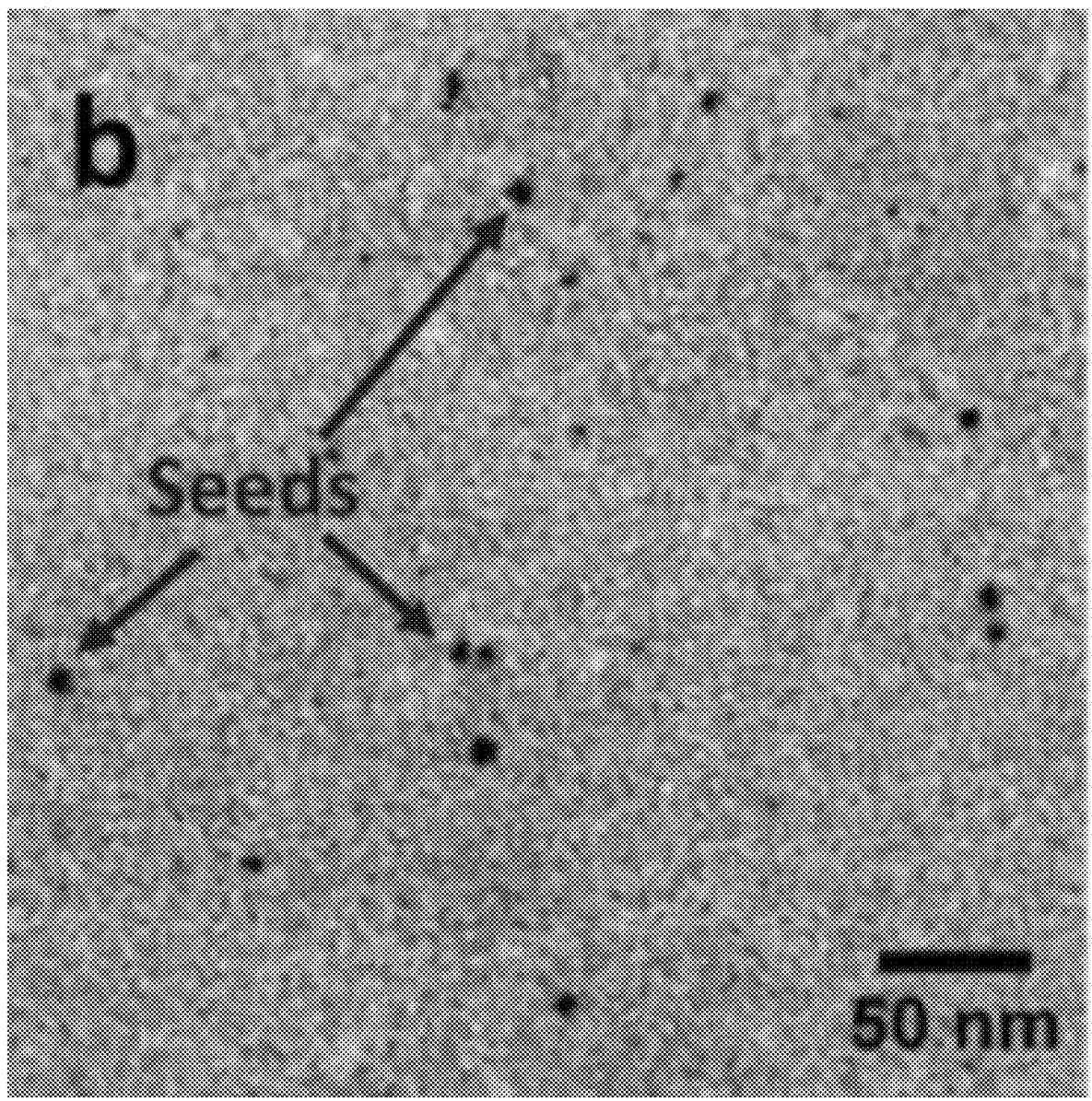
FIG. 2B illustrates a TEM bright-field image showing crystalline Ti seeds on an amorphous TiAl layer.

With reference now to FIG. 2B, in an exemplary embodiment, the deposition of seed layers 205 from FIG. 2A leads to the formation of well-dispersed seeds as shown in a transmission electron microscopy ("TEM") bright-field image of crystalline Ti seeds on an amorphous TiAl layer.

Figure 2C:
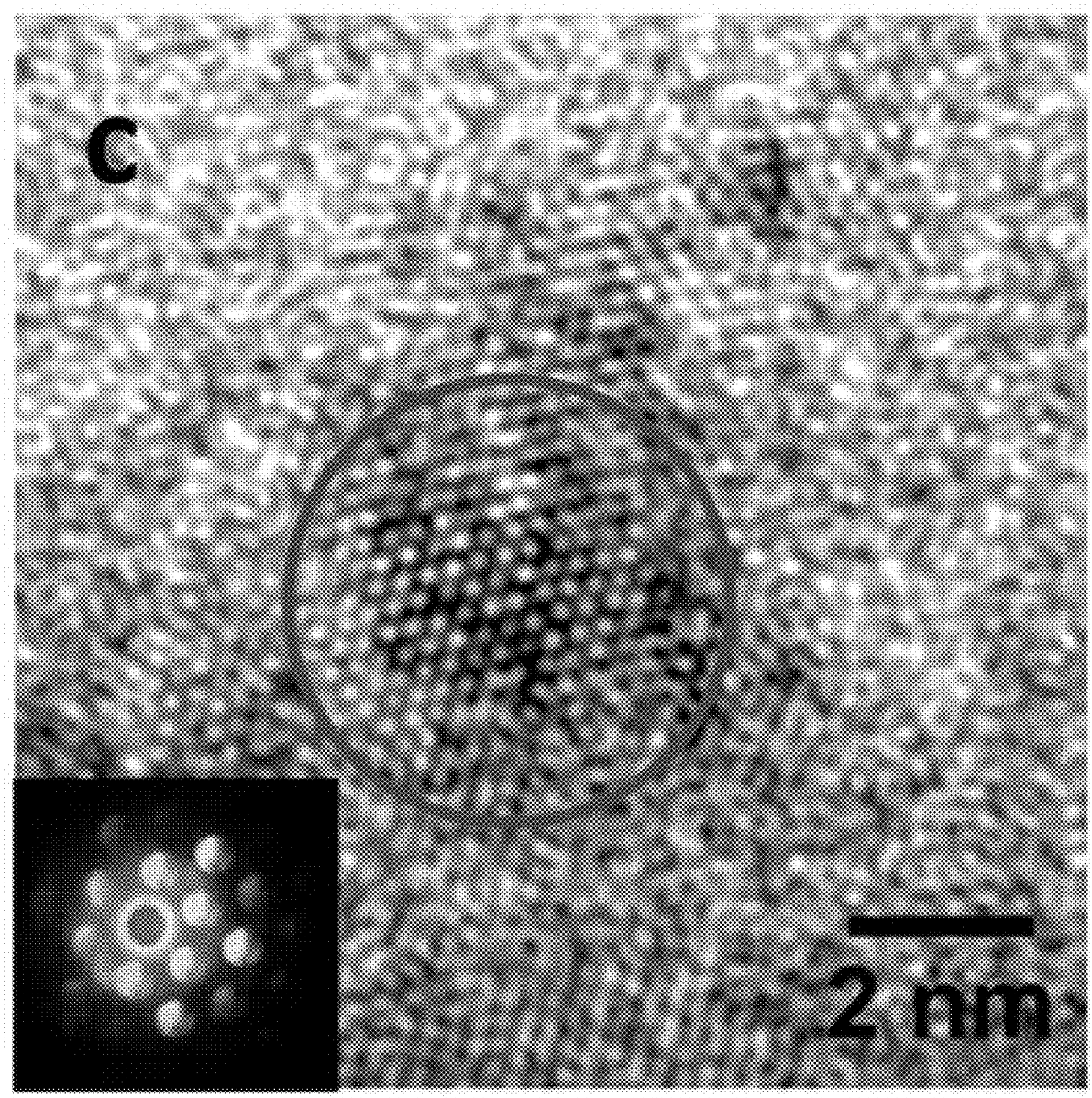
FIG. 2C illustrates an HR-TEM image showing the atoms on the plane of a Ti seed surrounded by the amorphous TiAl matrix and the CBED pattern of the seed in the inset.

With reference now to FIG. 2C, in an exemplary embodiment, the atoms on the plane of a titanium seed are surrounded by the amorphous TiAl matrix as revealed by high resolution TEM ("HR-TEM") and convergent beam electron diffraction ("CBED").

Figure 2D:
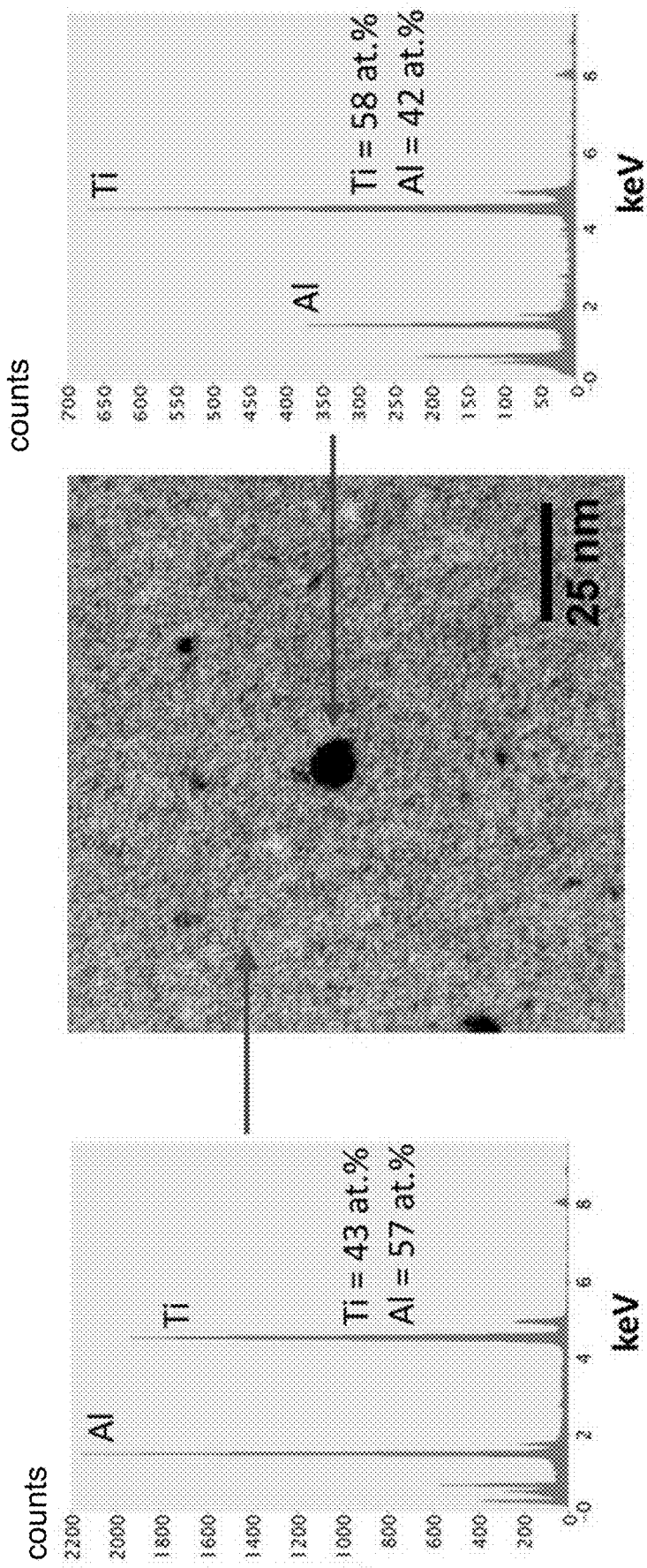
FIG. 2D illustrates in the middle of the panel a TEM bright-field image of an as-deposited 40 nm amorphous TiAl film with a 1 nm Ti seed layer, the EDS analysis of the seed region on the right of the panel and of the amorphous matrix on the left of the panel, revealing the difference in their composition.

With reference now to FIG. 2D, in an exemplary embodiment, energy dispersive X-ray spectroscopy ("EDS") analysis is used to differentiate the chemical composition of the seed region (right) and the amorphous matrix (left) seen in the TEM bright-field image (middle) of an as-deposited 40 nm amorphous TiAl film with a 1 nm Ti seed layer.

Figure 3A:
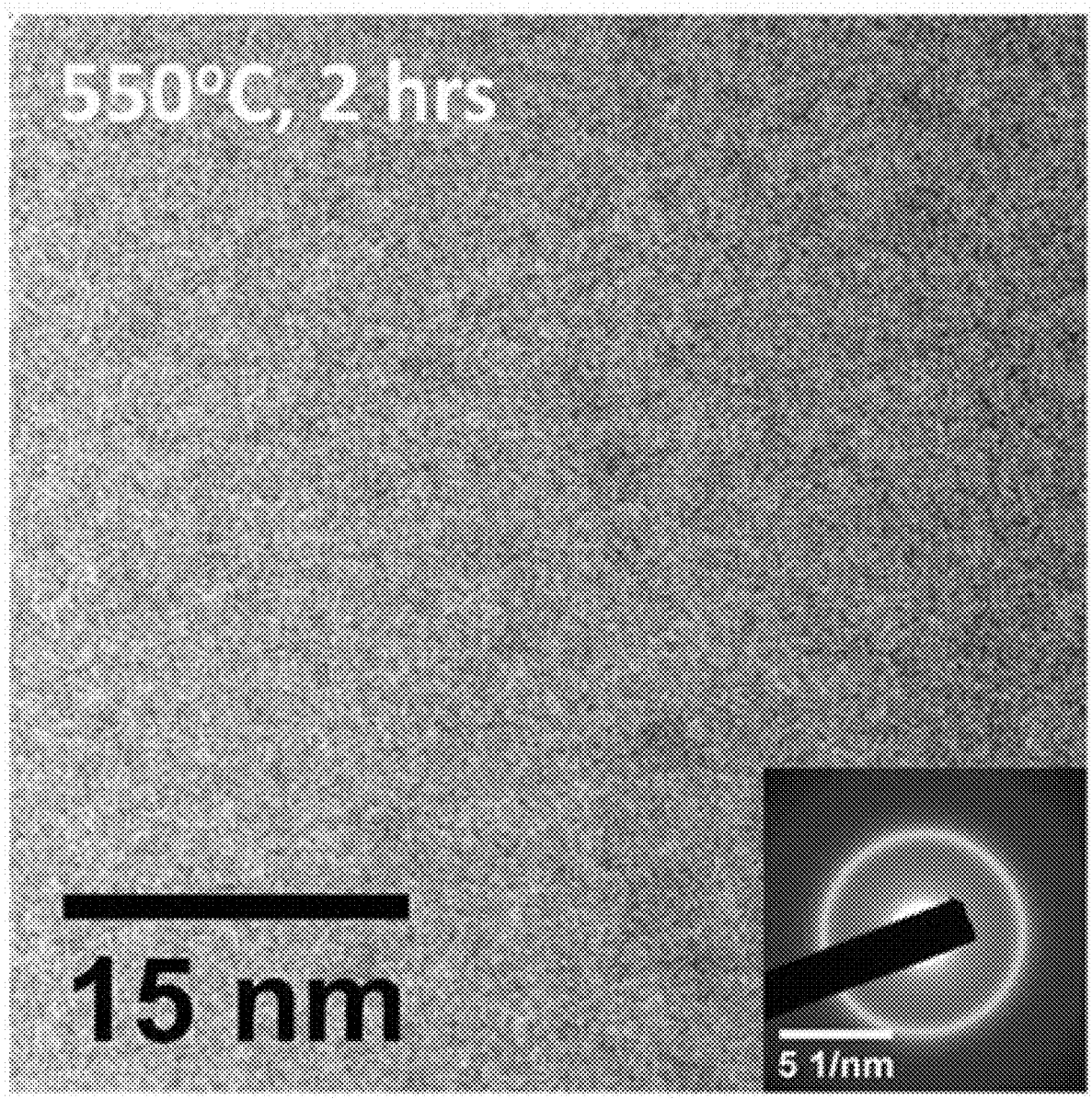
FIG. 3A illustrates a TEM bright-field image of a TiAl film with no seed layer after 2 hours of annealing at 550° C. and the diffuse ring in the selected area diffraction (SAD) pattern in the inset.
Figure 3B:
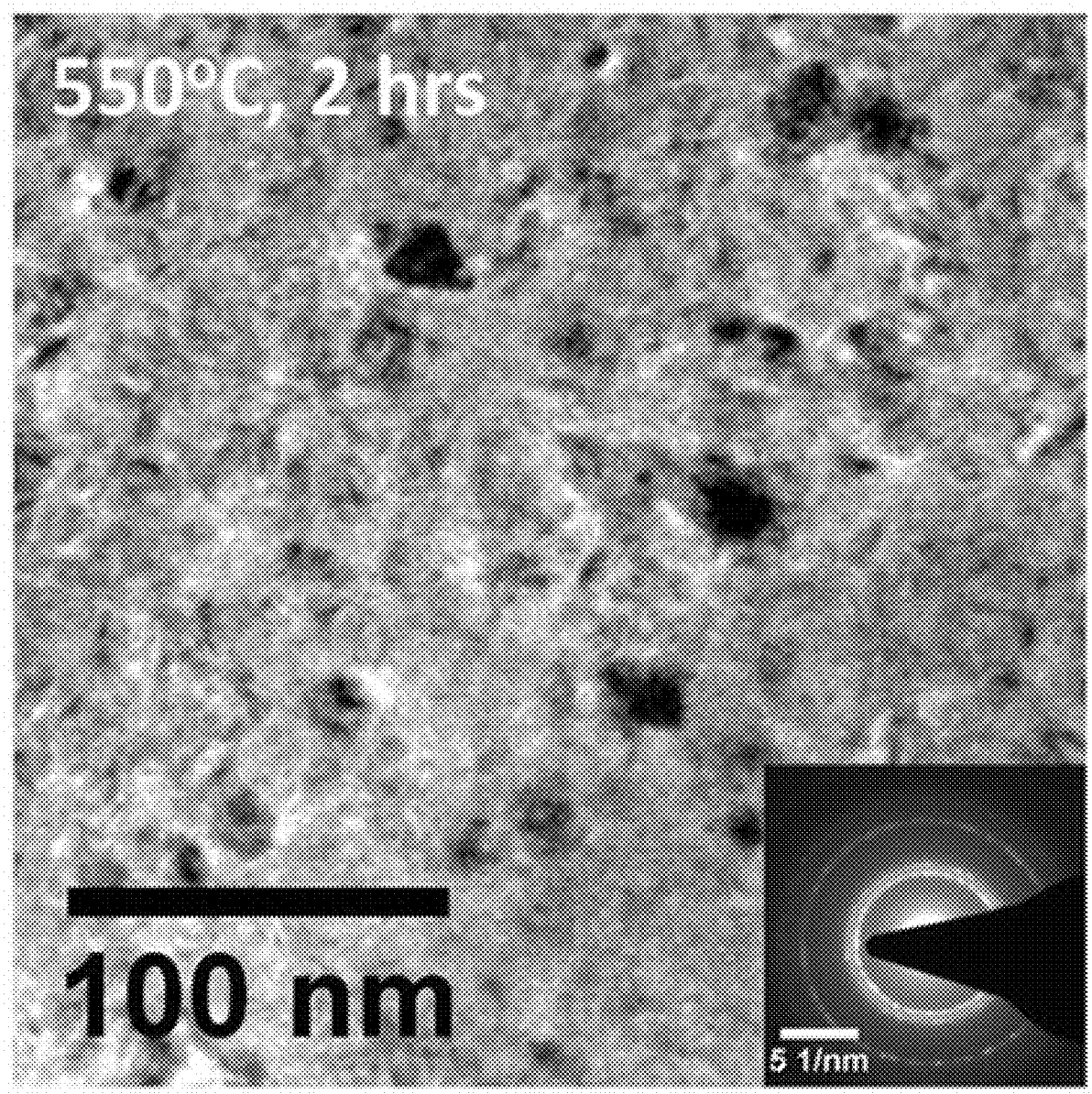
FIG. 3B illustrates a TEM bright-field image of a TiAl film with a single 1 nm Ti seed layer in the middle after 2 hours of annealing at 550° C. and the SAD pattern of the film in the inset.
Figure 3C:
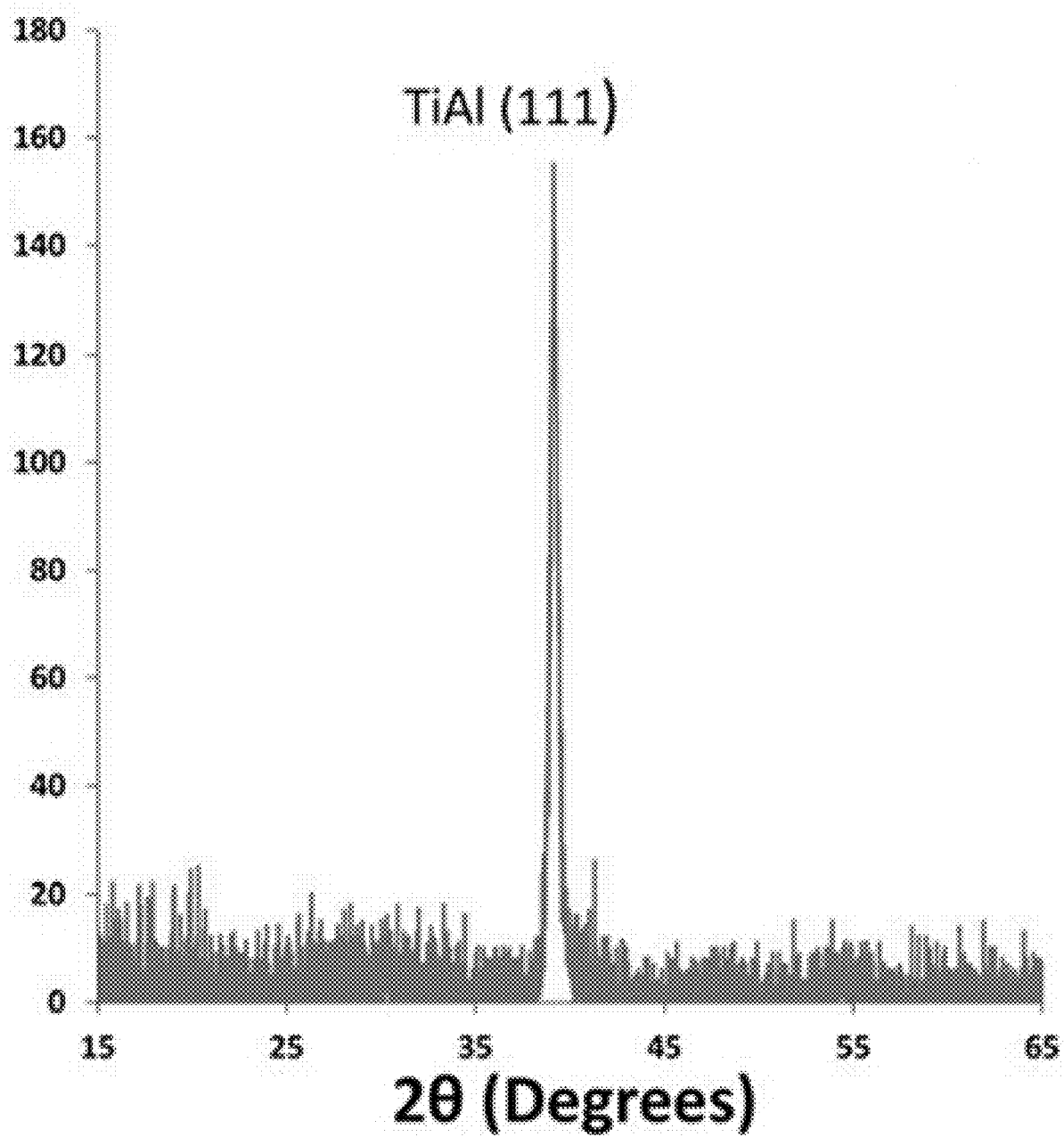
FIG. 3C illustrates an XRD pattern of a TiAl film with a single 1 nm Ti seed layer in the middle after 2 hours of annealing at 550° C.
Figure 4A:
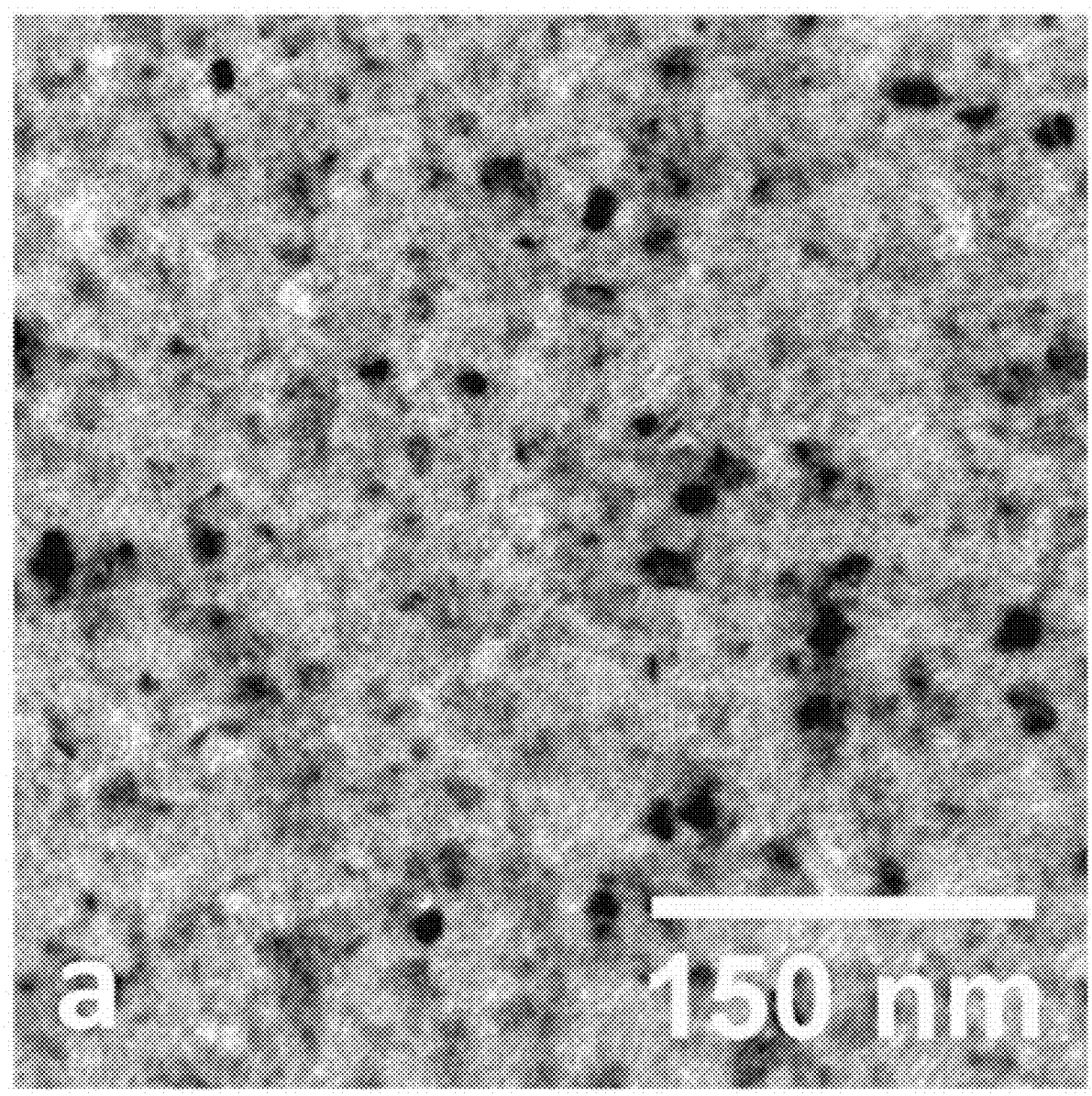
FIGS. 4A and 4B illustrate TEM images from in-situ annealing of a 100 nm thick TiAl film with a single 1 nm Ti seed layer.
Figure 4B:
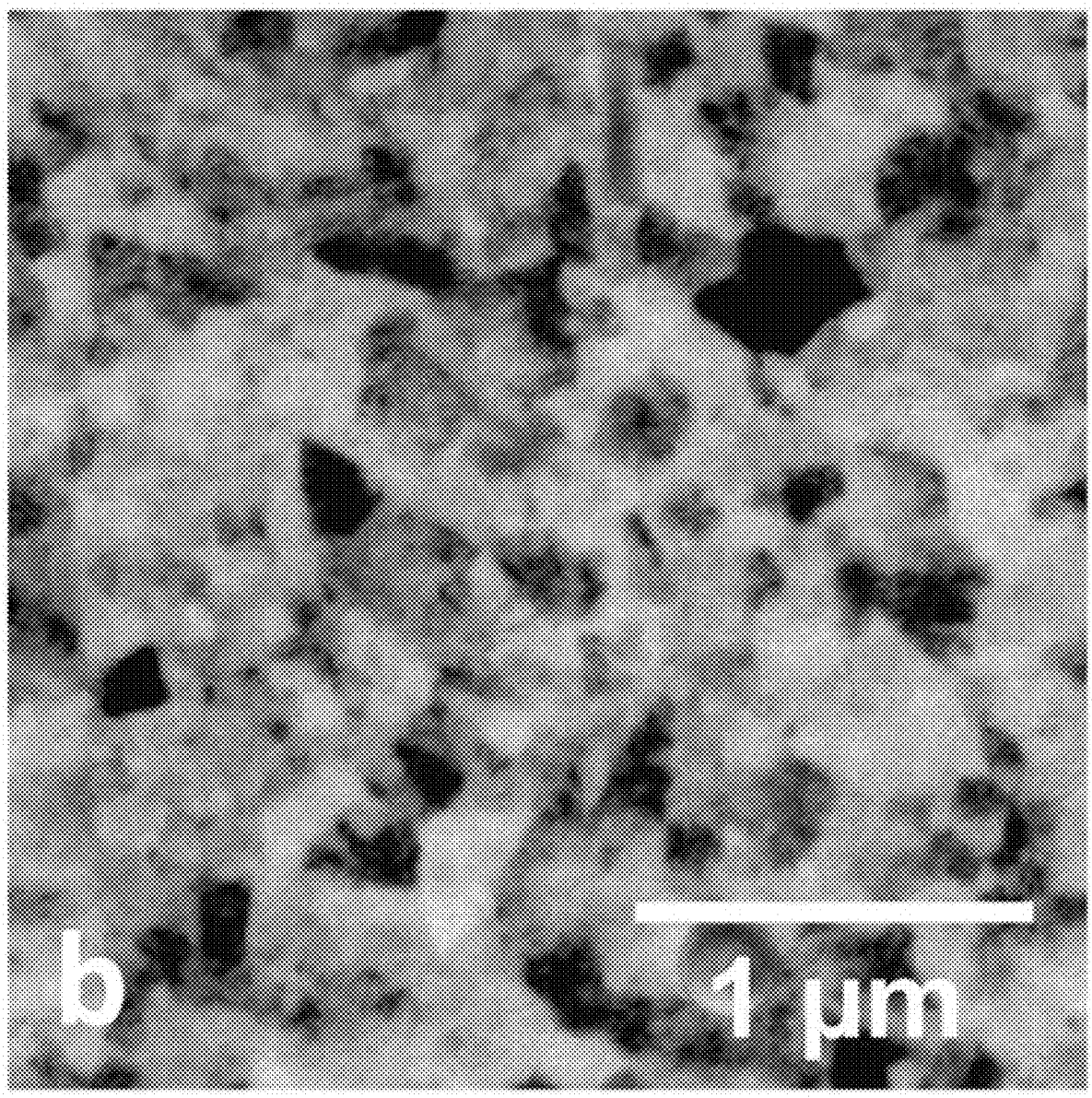
Figure 4C:
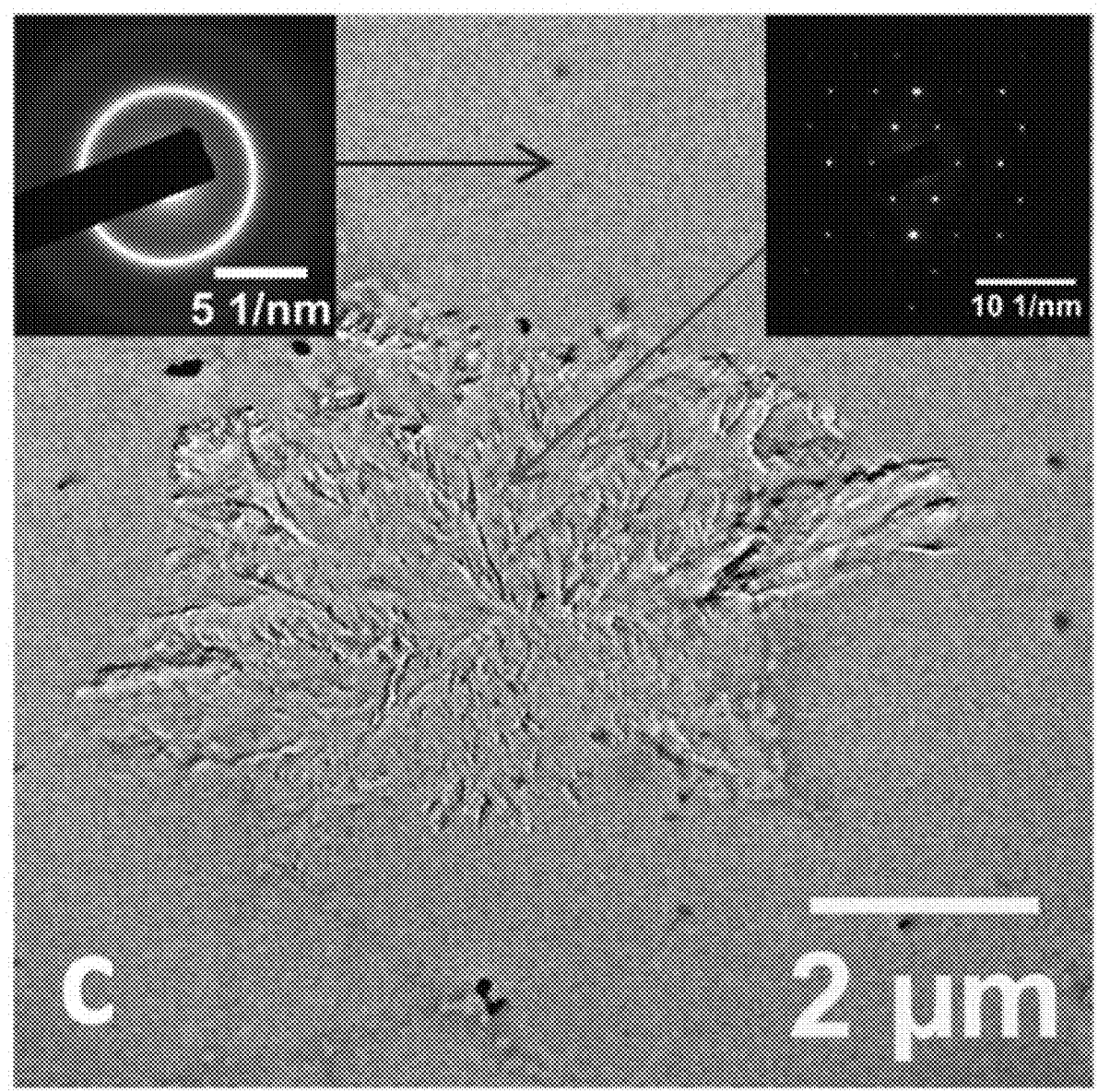
FIGS. 4C and 4D illustrate TEM images from in-situ annealing of an unseeded 100 nm thick TiAl film.
Figure 4D:
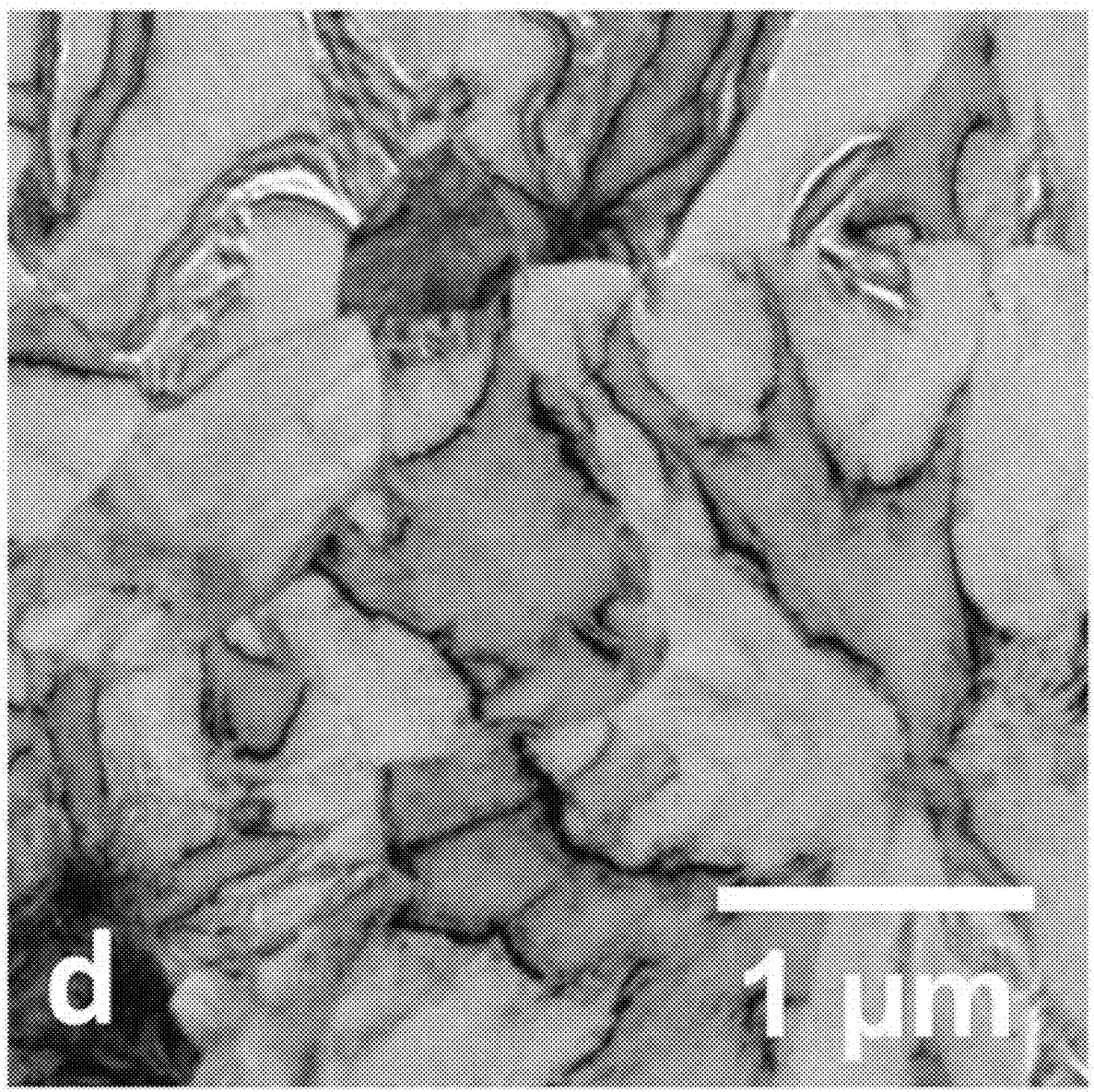

With reference now to FIGS. 3A-3C, in various exemplary embodiments, the seeds modify both the crystallization temperature and the final microstructure of the crystalline film 208 formed from method 100. With reference now to FIGS. 3A and 3B, in an exemplary embodiment, unseeded (FIG. 3A) and seeded (FIG. 3B) amorphous TiAl films are annealed at 550° C. for a period of two hours and the unseeded film remains completely amorphous as shown by the TEM bright-field image of FIG. 3A. The unseeded film of FIG. 3A remains completely amorphous as indicated by the diffuse ring in the selected area diffraction ("SAD") pattern (inset). In contrast, the seeded film (FIG. 3B) shows crystallization as revealed by TEM and x-ray powder diffraction ("XRD") analysis in FIGS. 3B and 3C. In effect, the seeds reduced the temperature required for crystallization and accelerated the crystallization process. Thus, as described further herein a seed material may be determined based on a desired crystallization temperature and/or crystallization speed, in accordance with various embodiments.

With reference now to FIG. 4, in various exemplary embodiments, the seeds influence the crystallization process of the film based on results of in-situ TEM annealing of seeded and unseeded TiAl films. In an exemplary embodiment, the TEM image in FIG. 3A showing in-situ annealing of a 100 nm thick TiAl film with a single 1 nm Ti seed layer indicates that crystallization starts around 550° C. in the seeded film with the simultaneous nucleation of a large number of grains after the film being heated at 550° C. for 1 h. In an exemplary embodiment, the TEM image in FIG. 4B shows that when the temperature is increased to 650° C. for a further 30 min, limited grain coalescence occurs and the mean grain size increases to about 100 nm. In contrast, the crystallization process was markedly different in the unseeded TiAl film. In an exemplary embodiment, TEM images of FIGS. 4C and 4D show the nucleation of a large crystalline phase with the rest of the film being still amorphous from in-situ annealing of an unseeded 100 nm thick TiAl film at 600° C. for 1 h and the formation of μm-sized grains from annealing at 650° C. for a further 30 min, respectively.

Figure 5B:
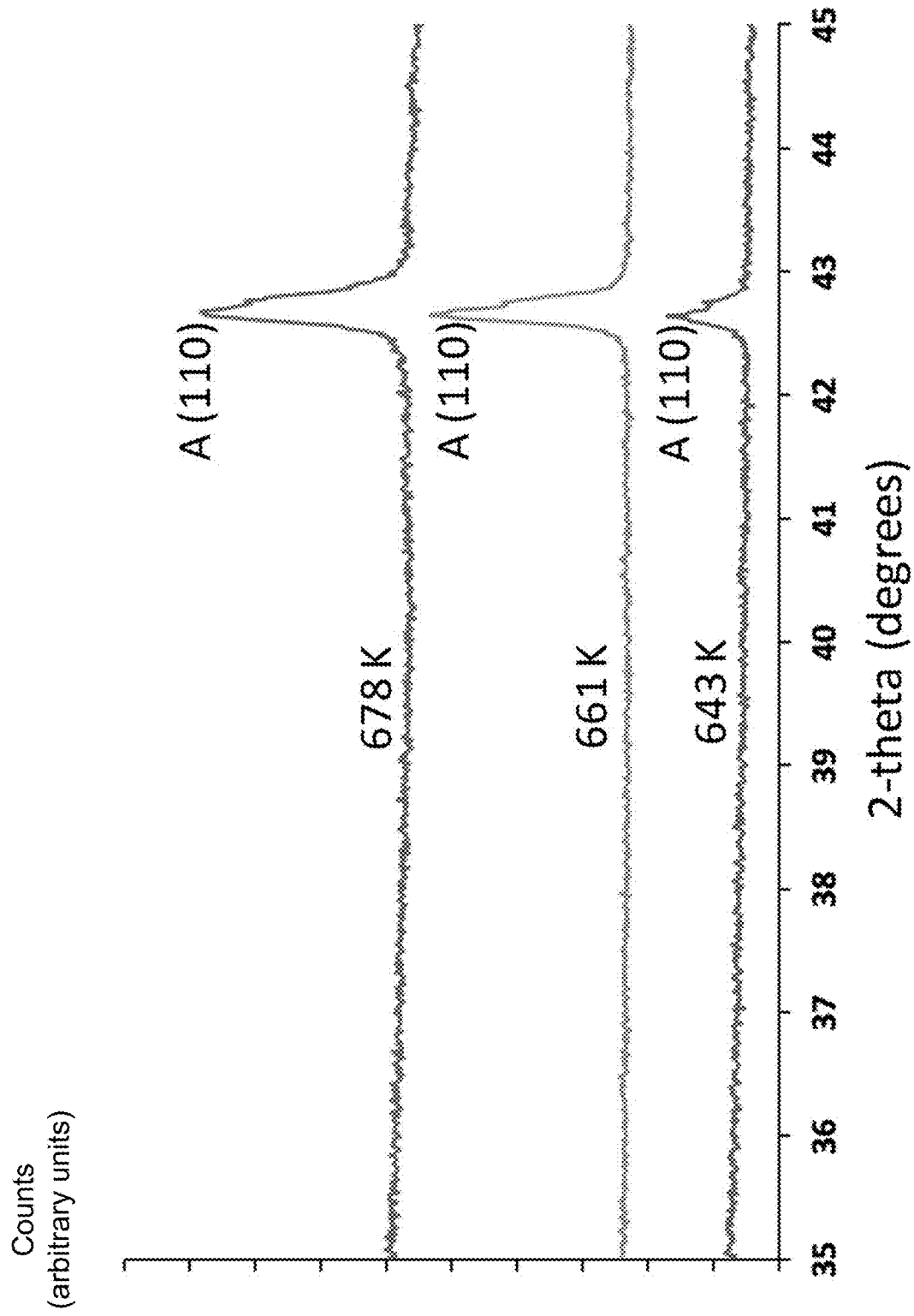
Figure 5C:
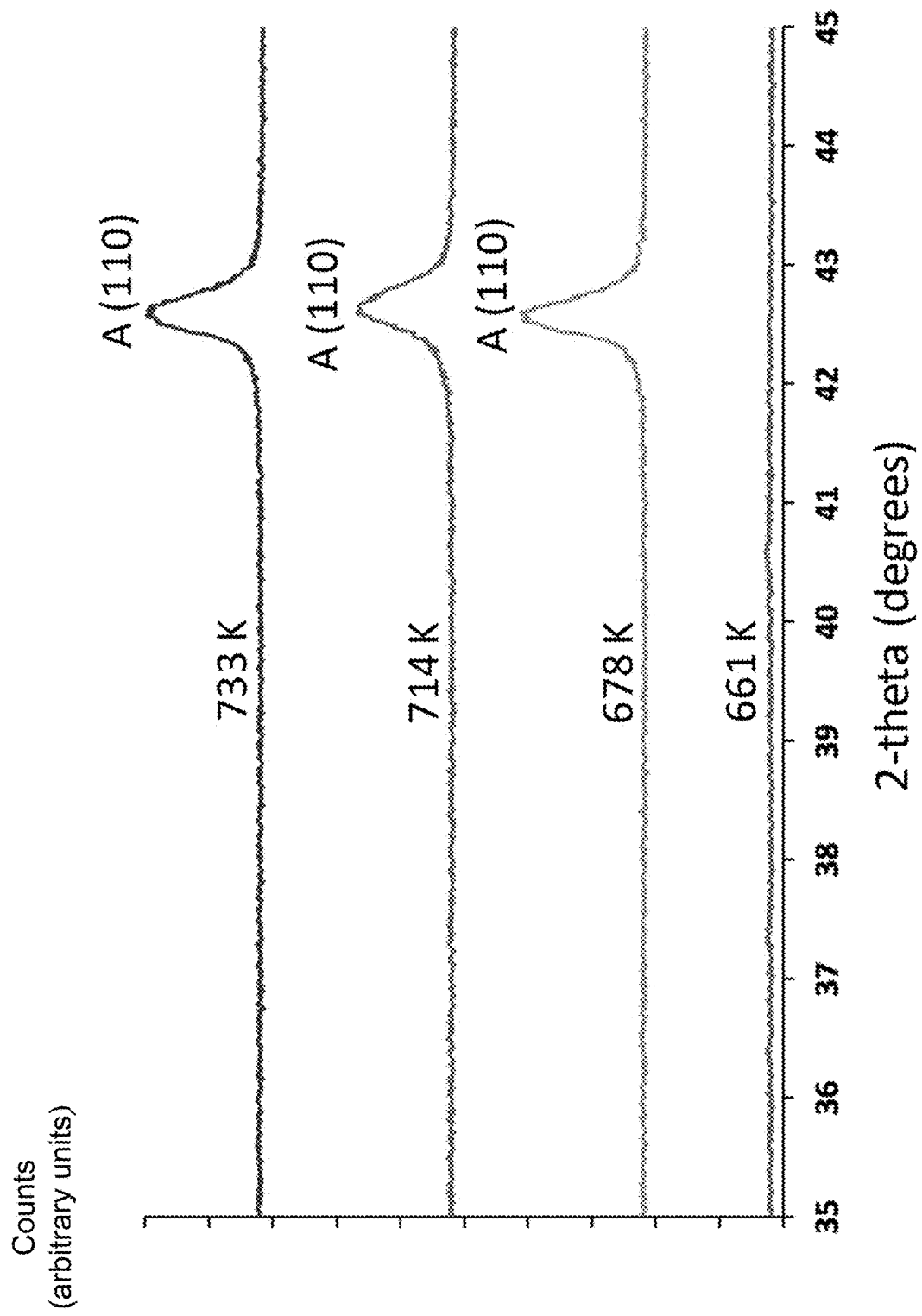
Figure 5D:
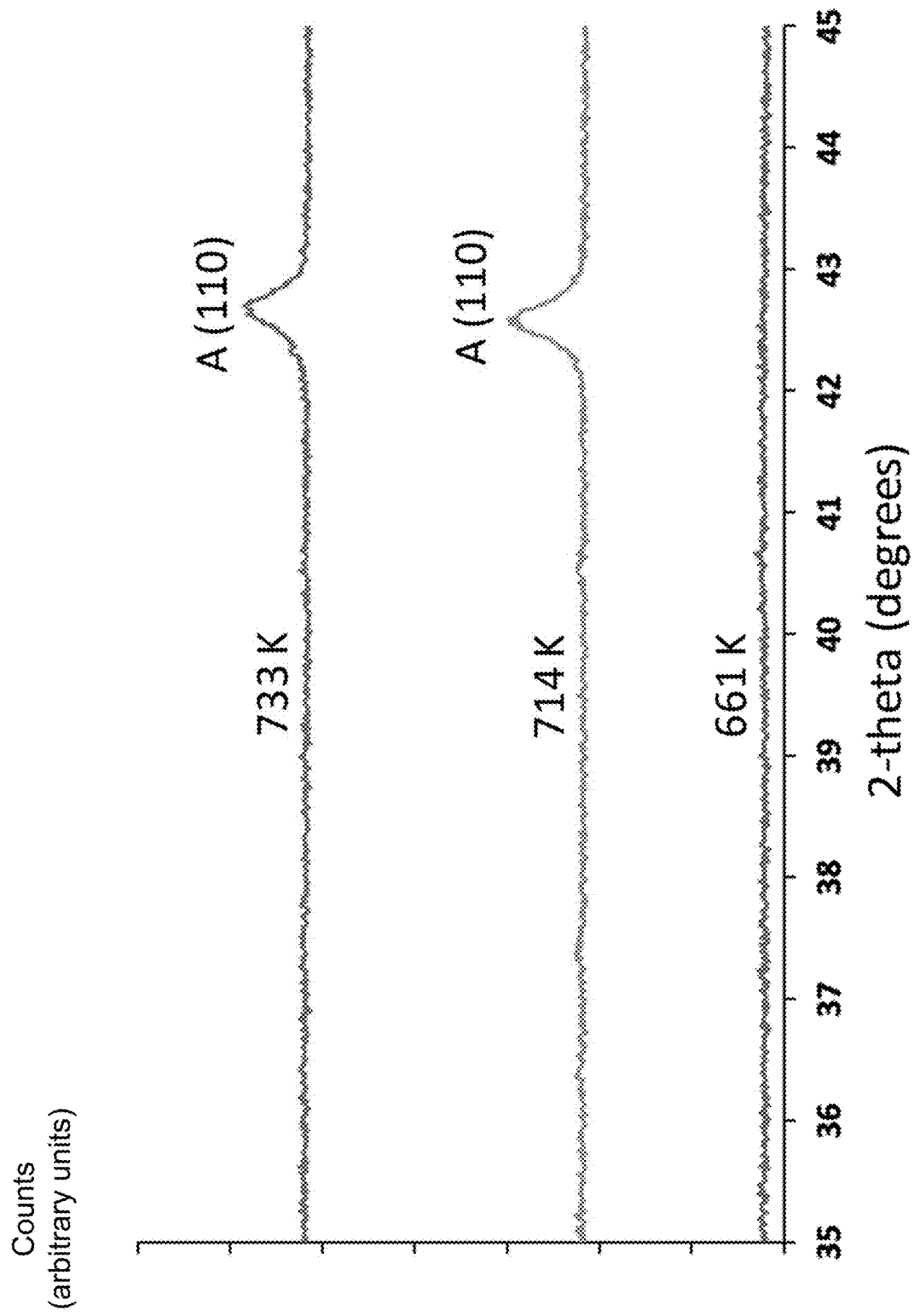

Referring now to FIG. 5A, 5B, 5C, 5D, plots of room temperature XRD data for amorphous Nitinol films are shown, with and without encapsulated seed layers, annealed at the indicated temperatures, in accordance with various embodiments. The various seed elements were disposed within an amorphous layer (e.g., amorphous layer 202 from FIG. 2A), in accordance with various embodiments. For example, FIG. 5A illustrates a plot of an unseeded Nitinol film, FIG. 5B illustrates a Nitinol film seeded with chromium seeds in accordance with method 100 from FIG. 1, FIG. 5C illustrates a Nitinol film seeded with tungsten seeds in accordance with method 100 from FIG. 1, and FIG. 5D illustrates a Nitinol film seeded with iron seeds in accordance with method 100 from FIG. 1. As illustrated, a crystallization temperature of a resultant film may be controlled by selecting a seed material to be encapsulated in a metal alloy in an amorphous form. For example, the unseeded Nitinol film exhibited a crystallization temperature of 750 Kelvin ("K") (FIG. 5A), the chromium seeded Nitinol film exhibited a crystallization temperature of 643 K (FIG. 5B), the tungsten seeded Nitinol film exhibited a crystallization temperature of 678 K, and the iron seeded Nitinol film exhibited a crystallization temperature of 714 K. In this regard, selection of a seed layer material for step 104 and selecting an annealing temperature for step 110 may facilitate significantly greater control over a microstructure creation relative to typical systems and methods.

Figure 6:
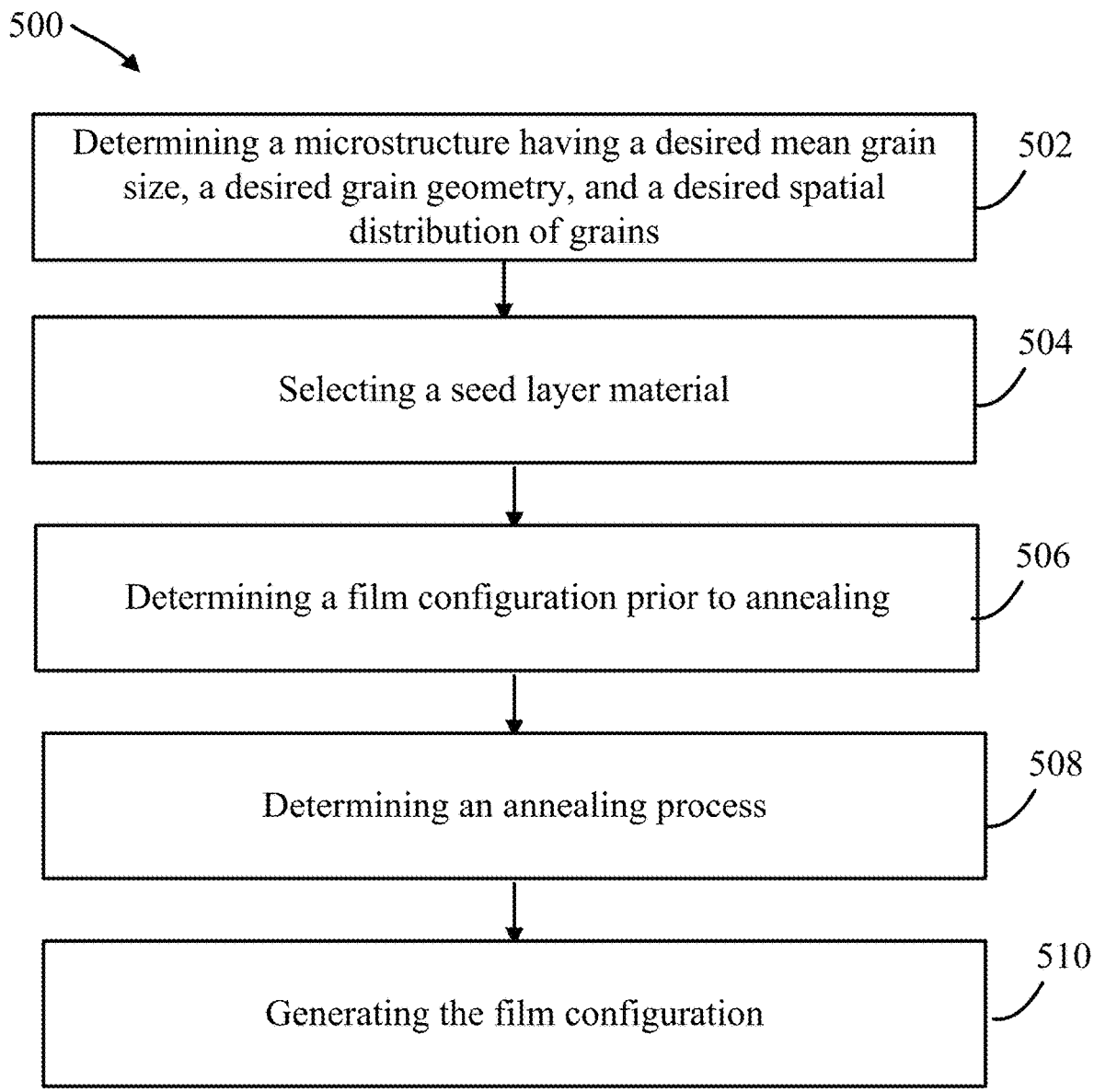
FIG. 6 illustrates a method for customizing a microstructure, in accordance with various embodiments.

Referring now to FIG. 6, a method 500 for customizing a microstructure is illustrated, in accordance with various embodiments. The method 500 comprises determining a microstructure having a desired mean grain size, a desired mean grain geometry, and a desired spatial distribution of grains (step 502). The various parameters of step 502 may be determined based on achieving material properties for a specific application of the microstructure as described previously herein.

The method 500 further comprises selecting a seed layer material (step 504). In various embodiments, step 504 may comprise selecting multiple seed layer materials. The seed layer material(s) may be chosen based on the desired mean grain size, the desired grain geometry, and/or the desired spatial distribution of grains from step 502. In this regard, a crystallization temperature of a film seeded with the selected material may be determined. Additionally, in response to having multiple seed layer materials, a first portion of a film may have a different crystallization temperature relative to a second portion of the film, further facilitating a controlled microstructure formation.

The method 500 further comprises determining a film configuration prior to annealing (step 506). The film configuration may include a number of seed layers to be deposited, a spacing of seed layers in film thickness direction, a spacing of seeds within a plane defined by the seed layer, or the like.

The method 500 further comprises determining an annealing process based on the desired mean grain size, the desired grain geometry, and the desired spatial distribution of grains (step 508). For example, a temperature cycle for the annealing process may be determined to achieve the desired characteristics of the microstructure from step 502. In this regard, an annealing temperature may be chosen to achieve the desired characteristics, an annealing temperature may be varied to achieve the desired characteristics, or the like.

The method 500 further comprises generating the film configuration (step 510). The film configuration may be generated in accordance with method 100 from FIG. 1. In this regard, based on the seed layer material selected, and film configuration determined, steps 102-108 of method 100 may be performed to create the film configuration prior to annealing, and then the annealing process determined from step 508 may be performed via step 110 of method 100, in accordance with various embodiments.

Figure 7:
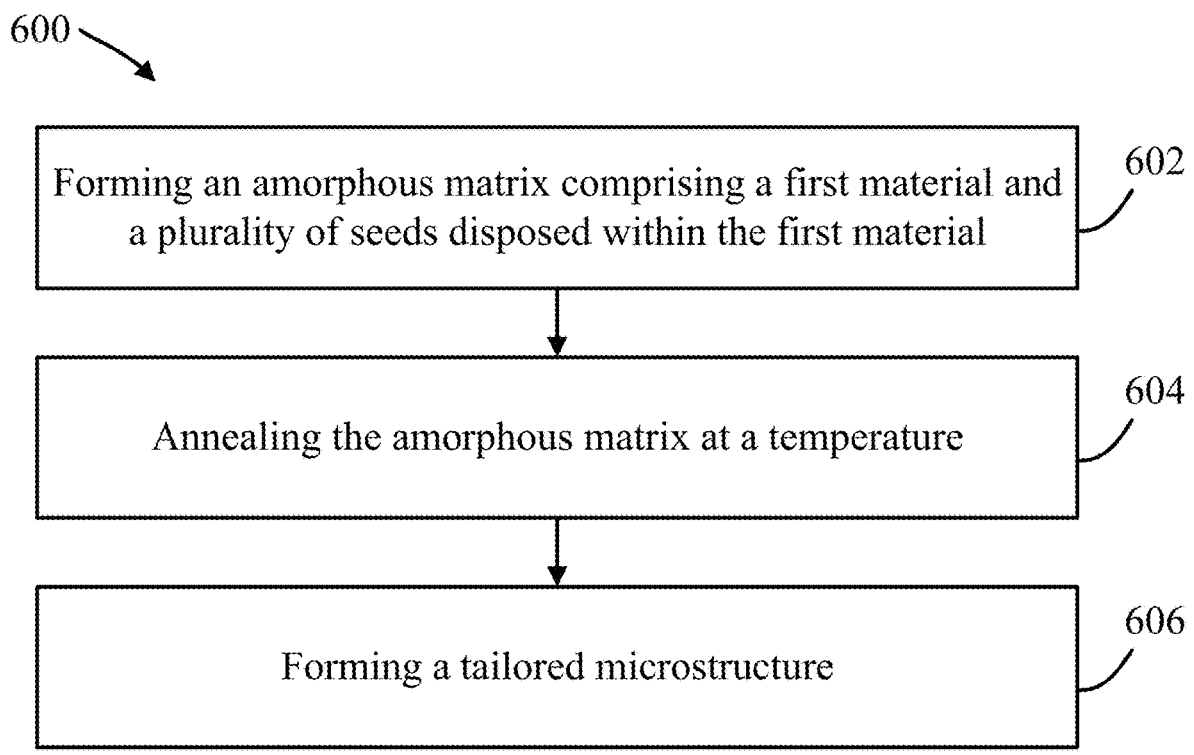
FIG. 7 illustrates a method of forming a tailored microstructure, in accordance with various embodiments.

Referring now to FIG. 7, a method 600 of forming a tailored microstructure is illustrated, in accordance with various embodiments. The method 600 comprises forming an amorphous matrix comprising a first material and a plurality of seeds disposed within the first material (step 602). The first material may comprise a metal alloy, a ceramic material, a semiconductor material or the like. In various embodiments the plurality of seeds may be disposed in a single layer, multiple layers or the like. In various embodiments, the plurality of seeds may all be the same material or may include different materials. In various embodiments, the plurality of seeds may comprise a first set of seeds having a first material and a second set of seeds having a second material. The first material may facilitate a first crystallization temperature for a portion of amorphous matrix, whereas the second material may facilitate a second crystallization temperature of a second portion of the amorphous matrix. In various embodiments, the first crystallization temperature may be greater than the second crystallization temperature. In this regard, the first material may facilitate a larger grain size for the first portion of the amorphous matrix relative to the second material for the second portion of the amorphous matrix during an annealing process at a specific temperature as described further herein.

In various embodiments, the method 600 further comprises annealing the amorphous matrix at a temperature (step 604). The temperature may be predetermined based on a desired grain size for the first portion and the second portion of the amorphous matrix from step 602.

Figure 8A:
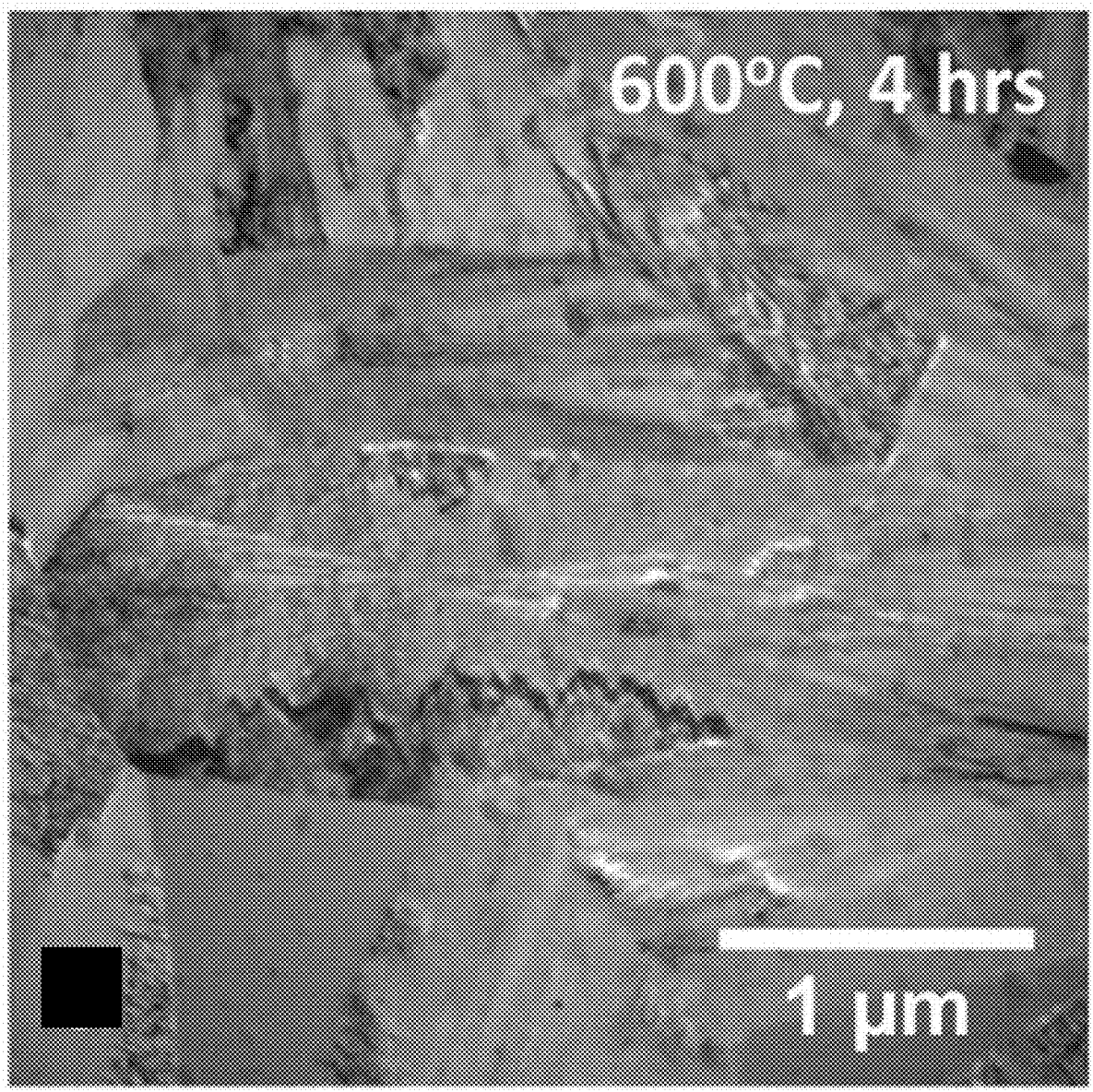
FIG. 8 illustrates tailored microstructures (FIGS. 8(b), 8(c), 8(e), and 8(f)) compared to a control microstructure (i.e., an unseeded film of FIGS. 8(a), 8(d)), in accordance with various embodiments.
Figure 8B:
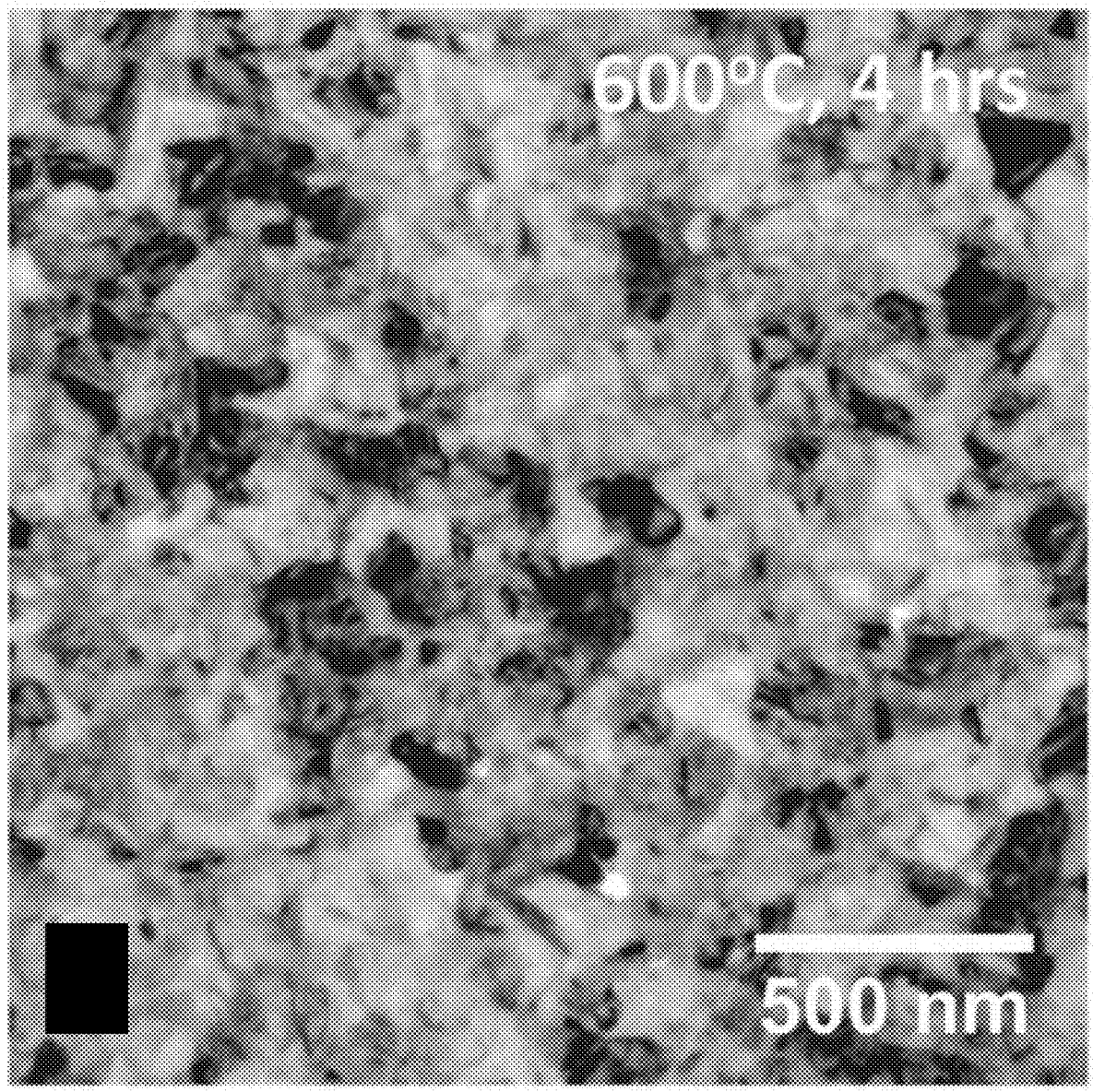
Figure 8C:
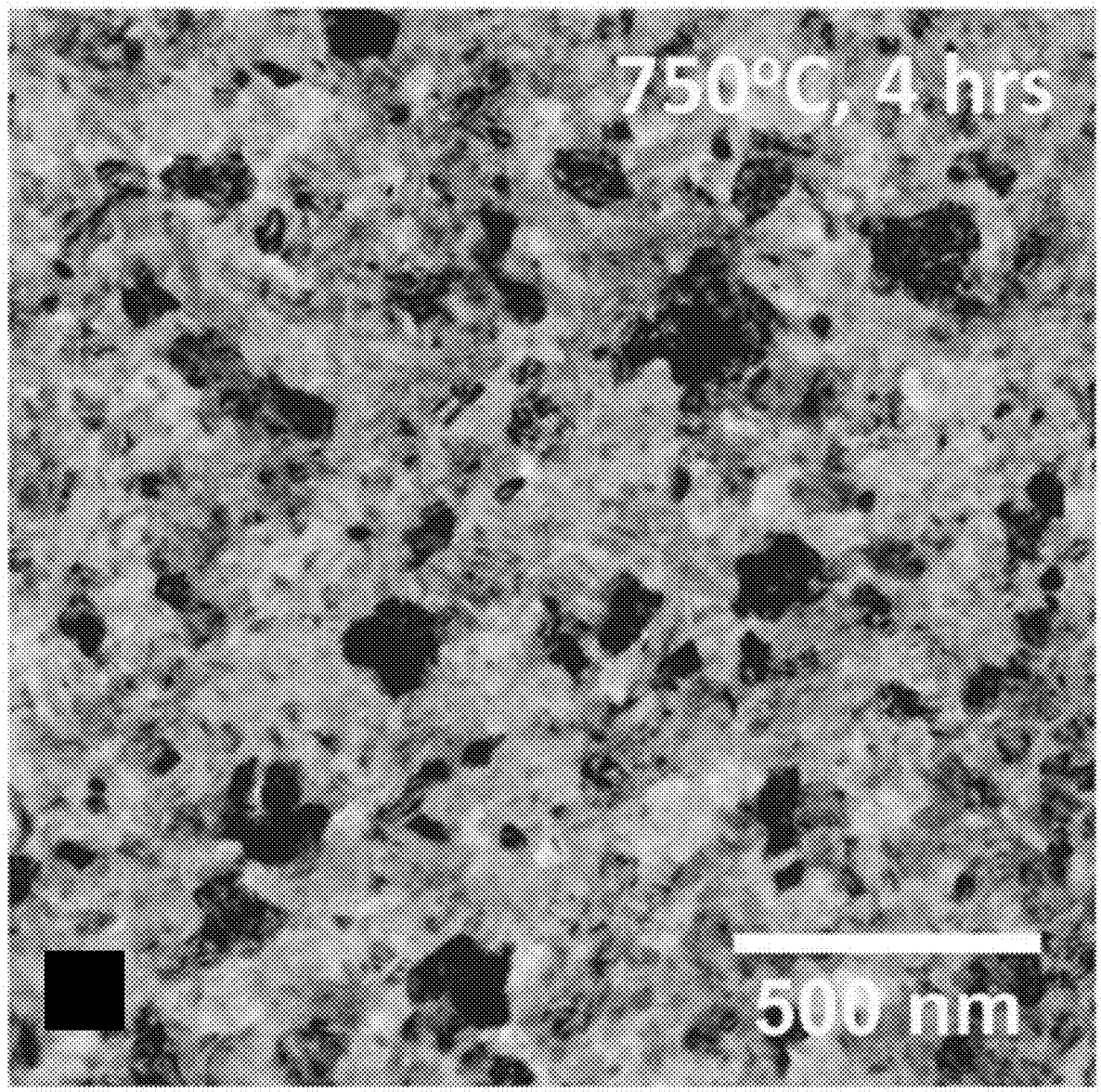
Figure 8D:
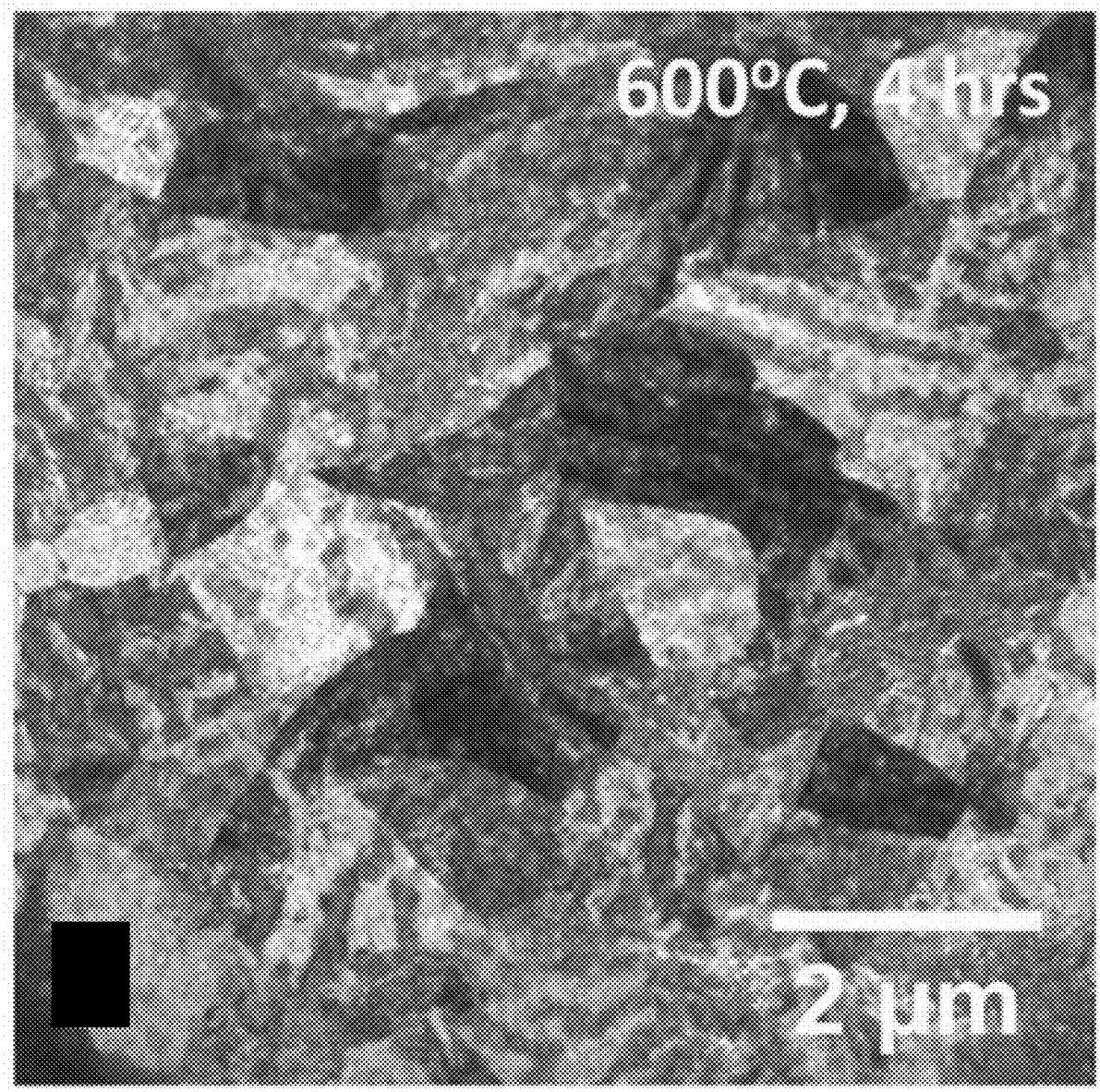
Figure 8E:
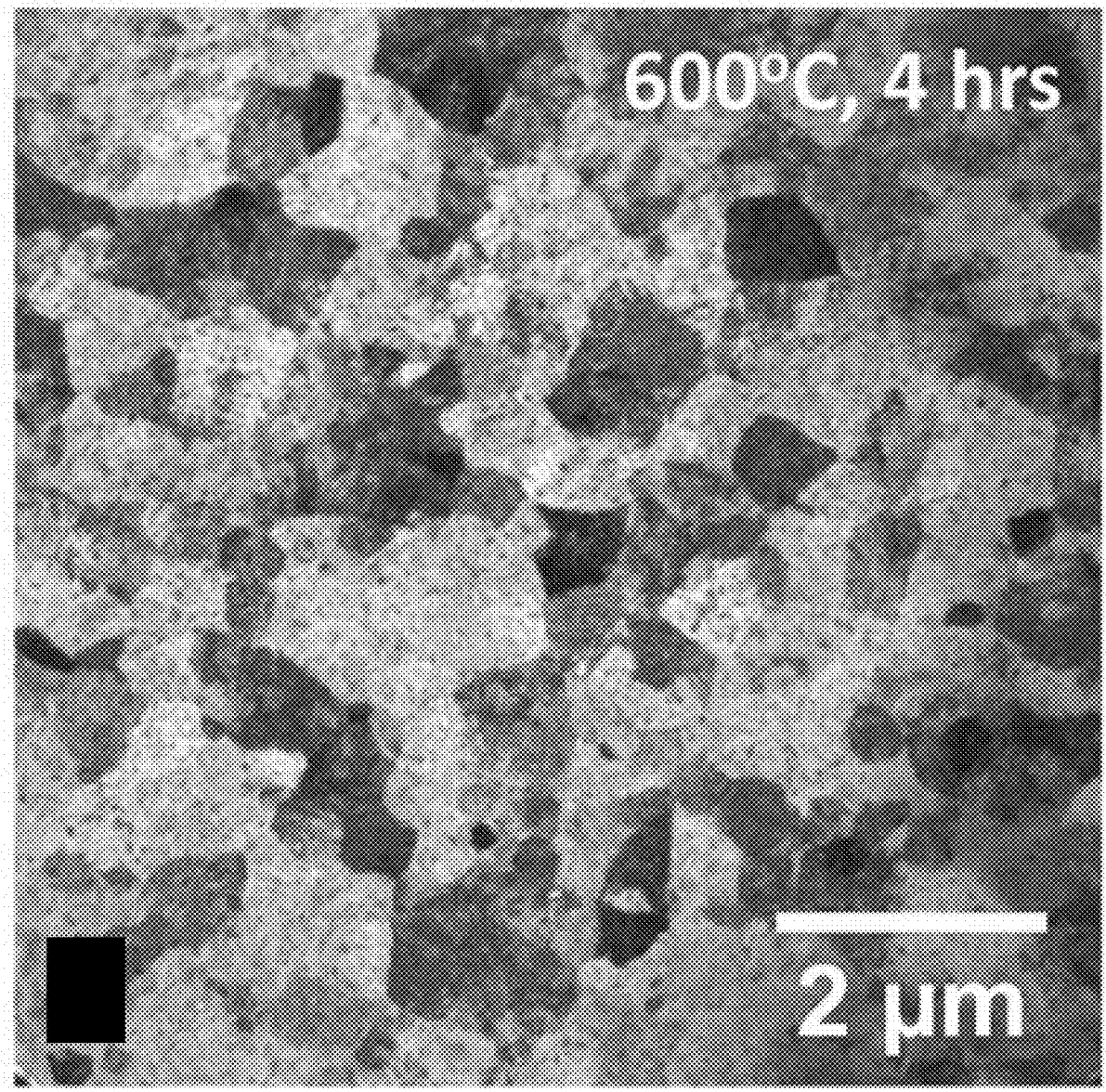
Figure 8F:
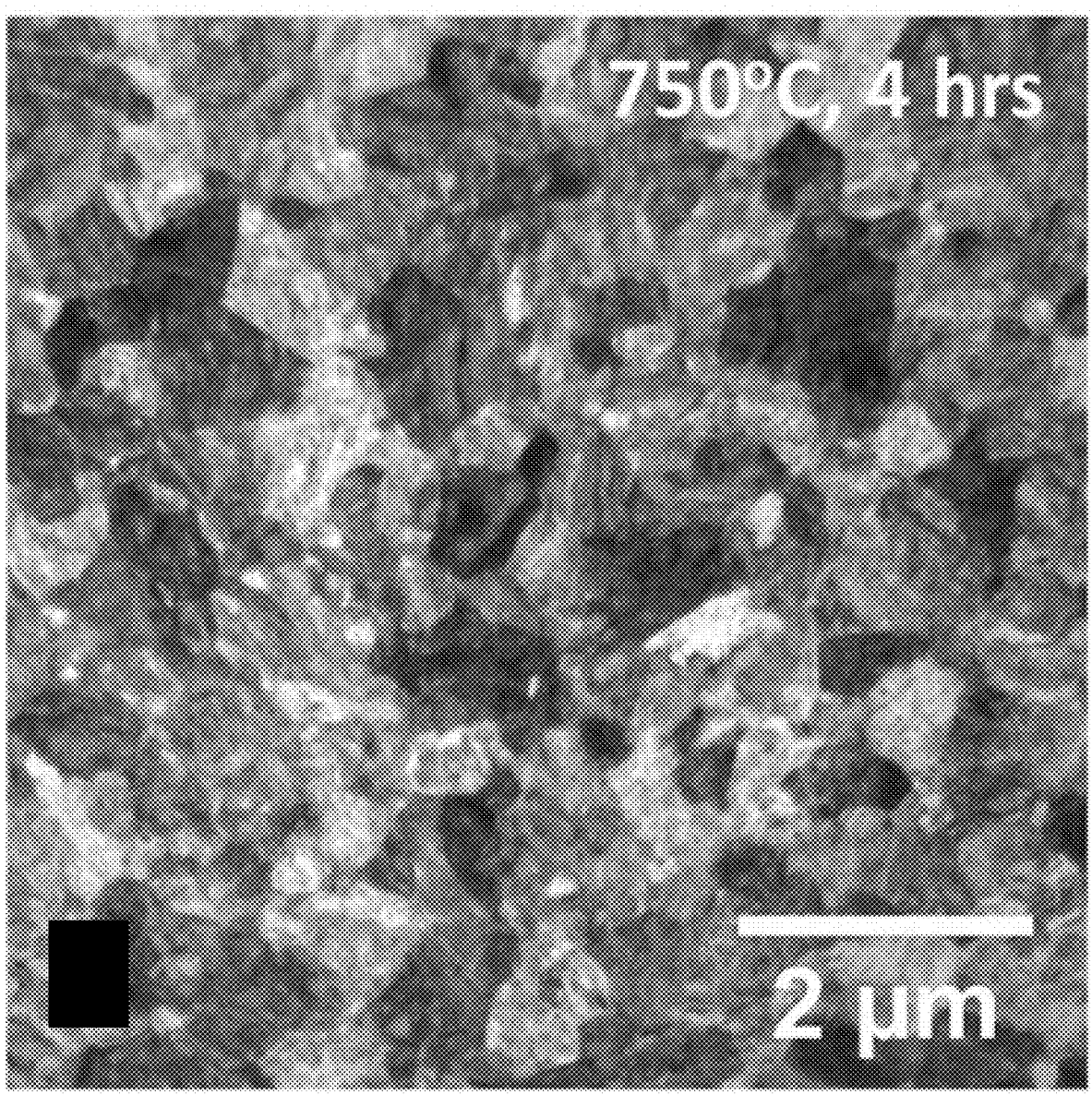

FIG. 8 illustrates a tailored microstructure (FIGS. 8(b), 8(c), 8(e), and 8(f)) compared to control microstructures (i.e., an unseeded film of FIGS. 8(a), 8(d)), in accordance with various exemplary embodiments. FIG. 8(a) illustrates a TiAl film with no seed layer (mean grain size $d_m$=1.15+/−0.2 μm). FIG. 8(b) illustrates a TiAl film with a single 1 nm Ti seed layer ($d_m$=65+/−35 nm). FIG. 8(c) illustrates TiAl film with a single 1 nm Ti seed layer (dm=68+/−39 nm). FIG. 8(d) illustrates a TiNi film with no seed layer (dm=1.44+/−0.29 μm). FIG. 8(e) illustrates a TiNi film with a single 1 nm Ti seed layer (dm=540+/−150 nm). FIG. 8(f) illustrates TiNi film with a single 1 nm Ti layer (dm=580+/−124 nm). All the films were 100 nm thick and the annealing temperature and time are indicated in the images. For all seeded films, the seed layer was deposited in the middle. The +/−values in dm correspond to the standard deviation.

Figure 9A:
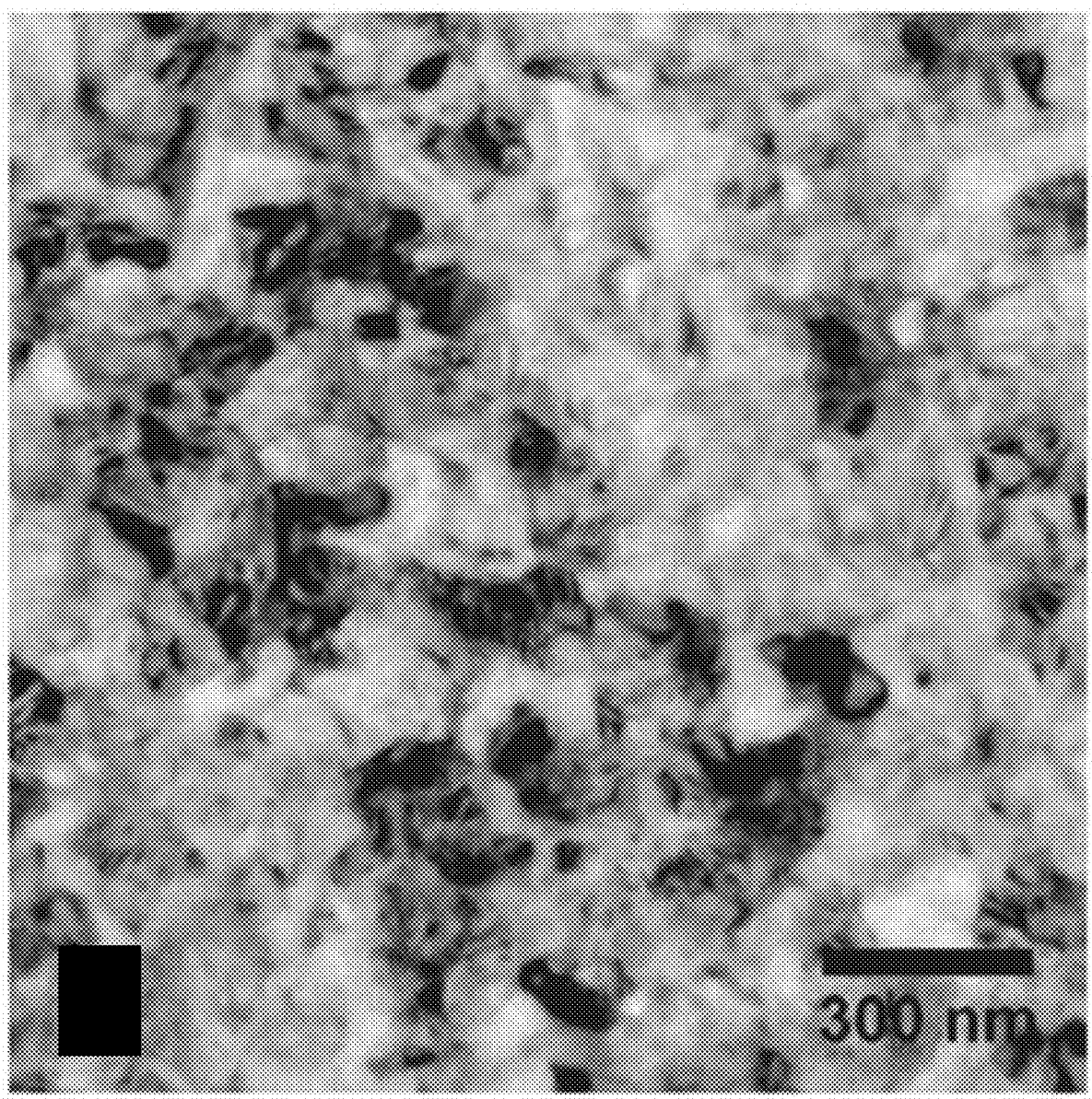
FIG. 9 illustrates (FIGS. 9(a), 9(b), and 9(c)) various TEM bright field images of three different 100 nm thick TiAl films with a single 1 nm Ti seed layer, in accordance with various embodiments.
Figure 9B:
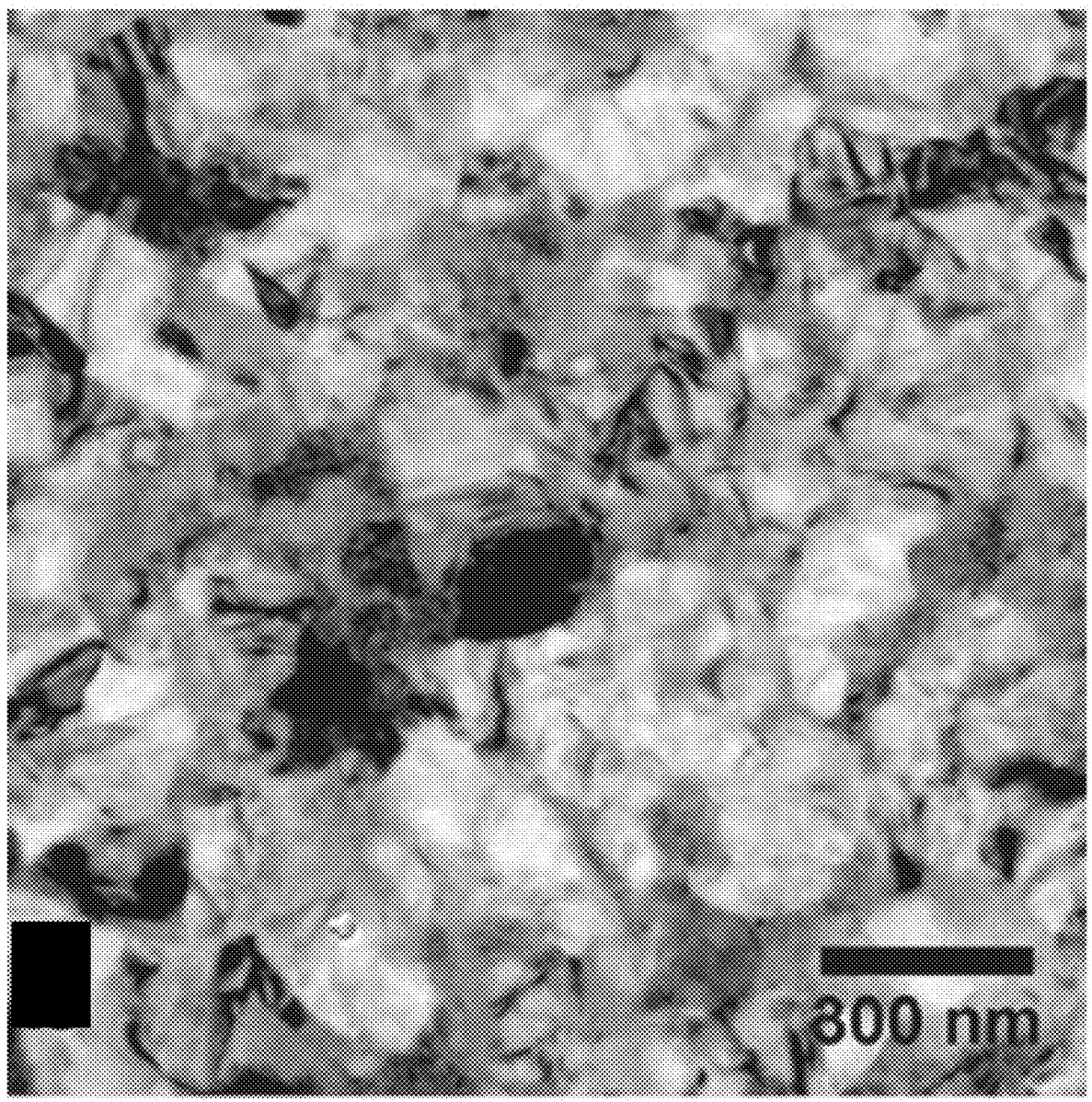
Figure 9C:
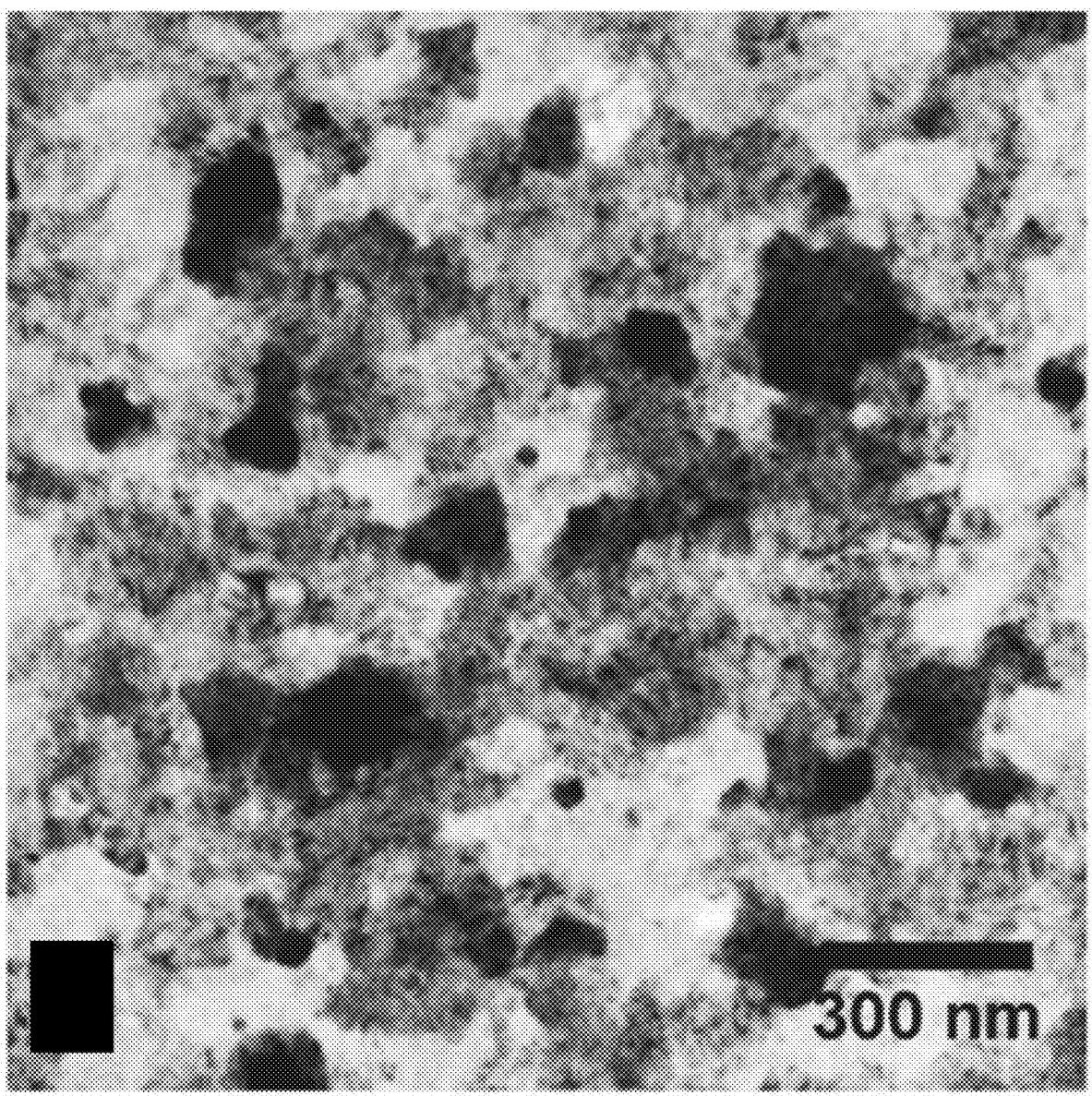
Figure 10A:
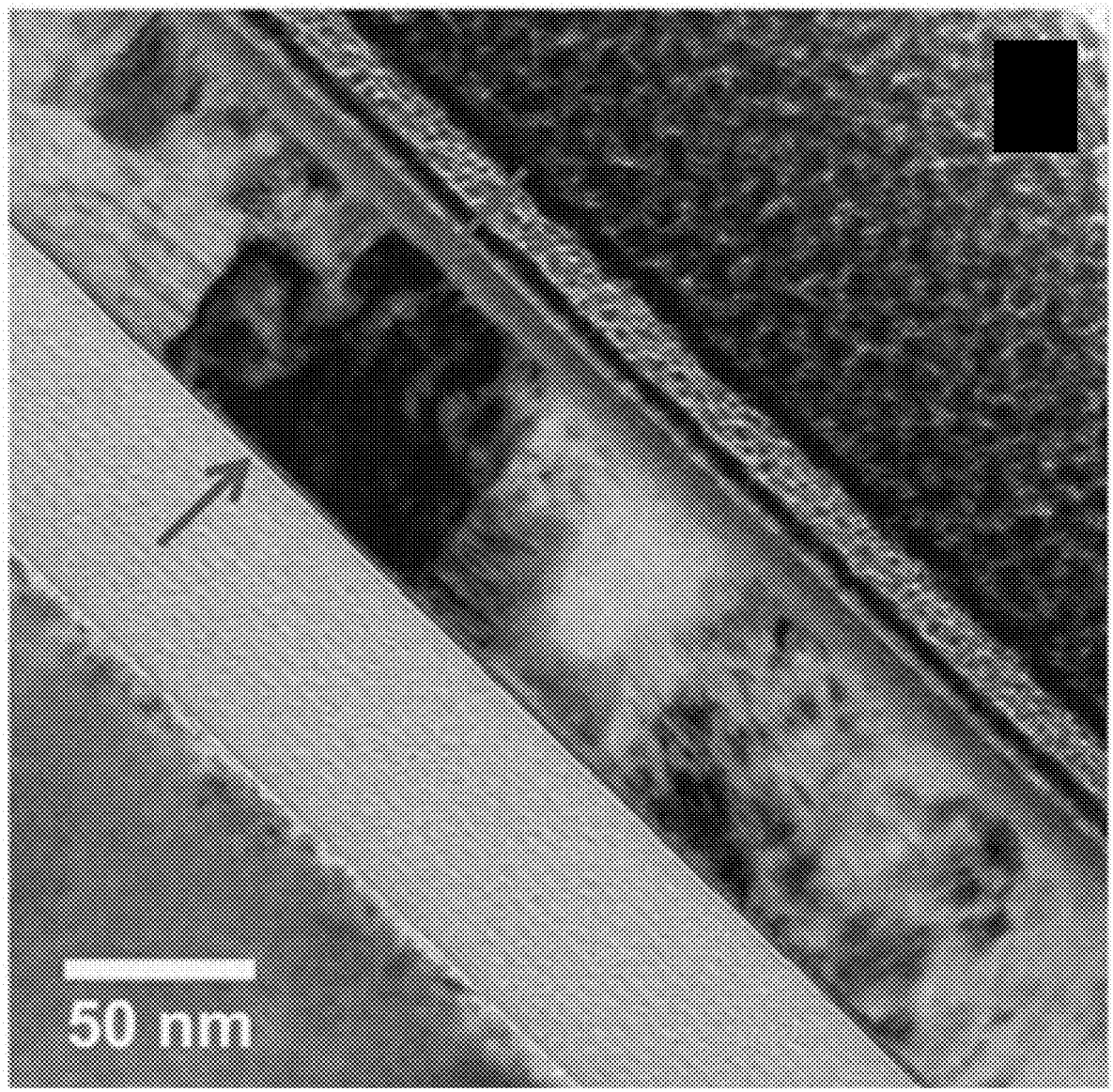
FIG. 10 illustrates (FIGS. 10(a), 10(b), 10(c), 10(d), 10(e), and 10(f)) various cross-sectional TEM bright-field images of various film configurations, in accordance with various embodiments.
Figure 10B:
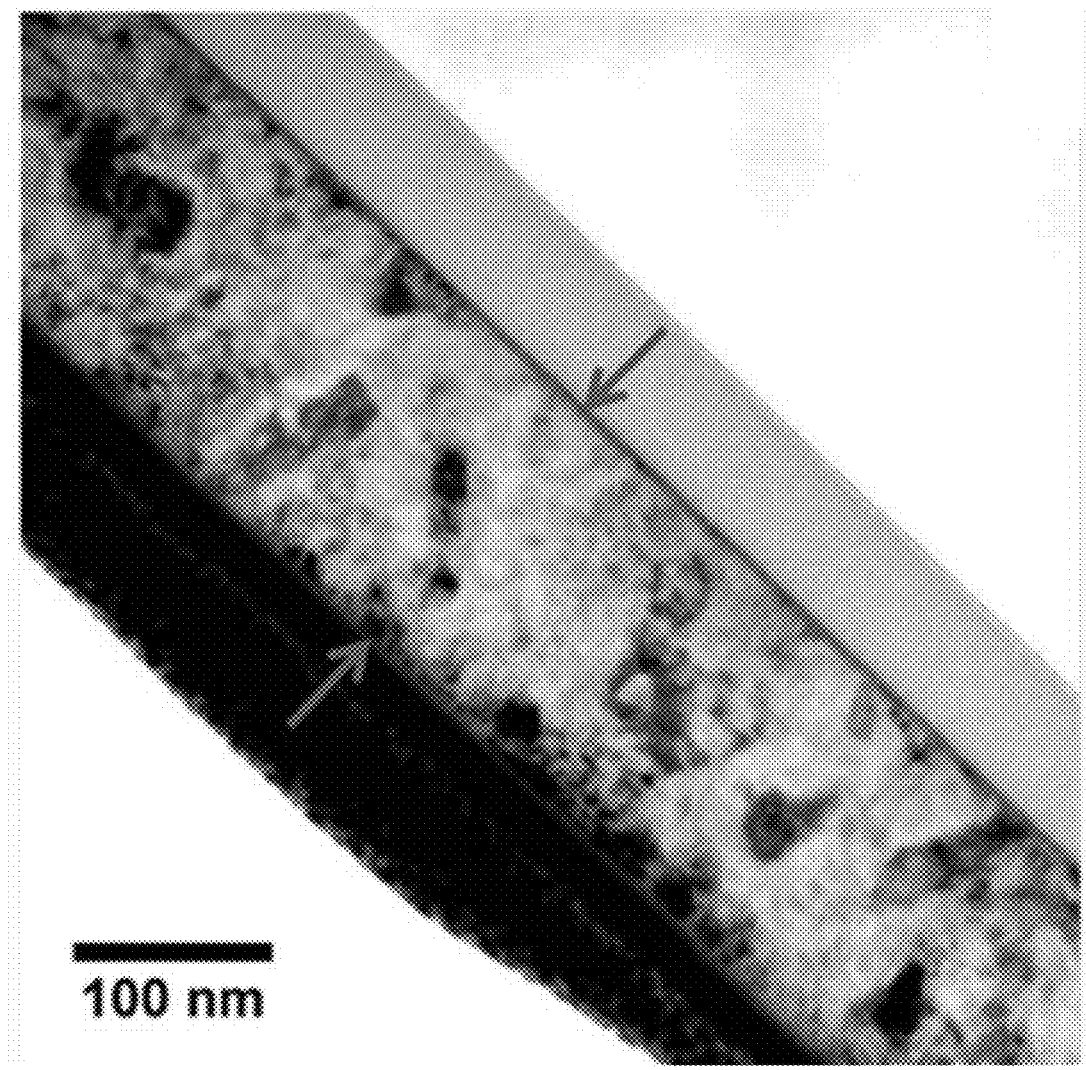
Figure 10C:
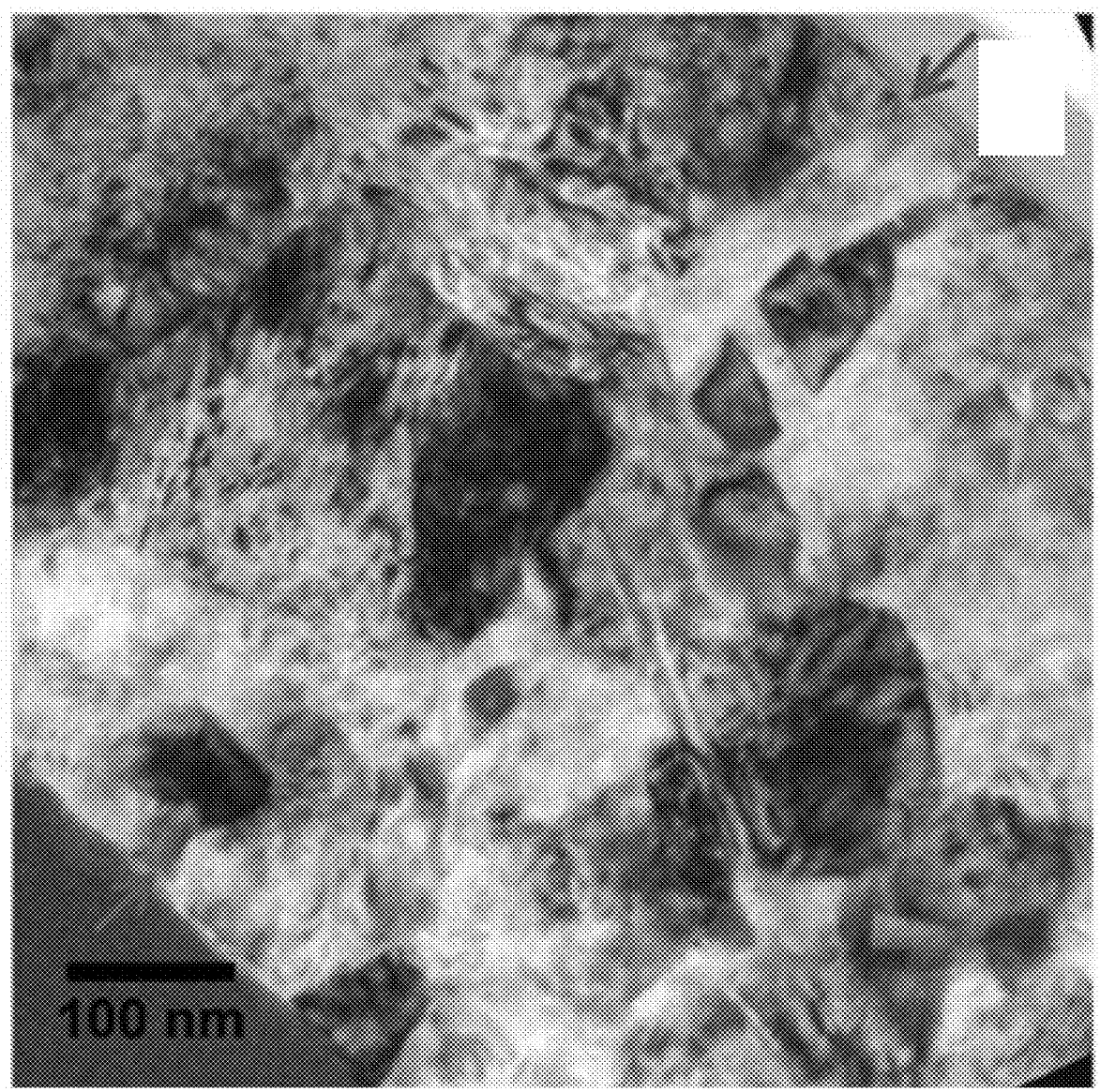
Figure 10D:
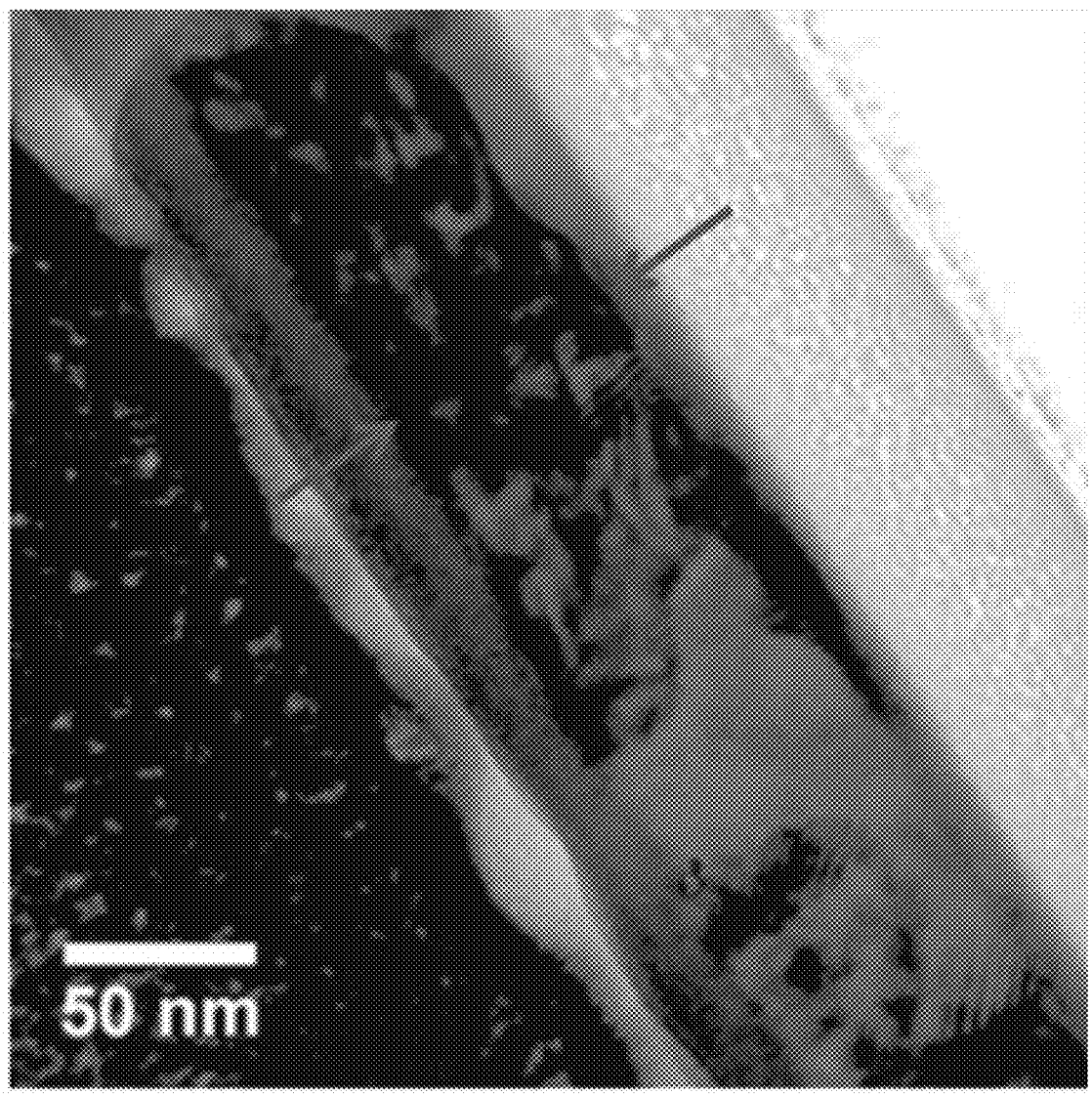
Figure 10E:
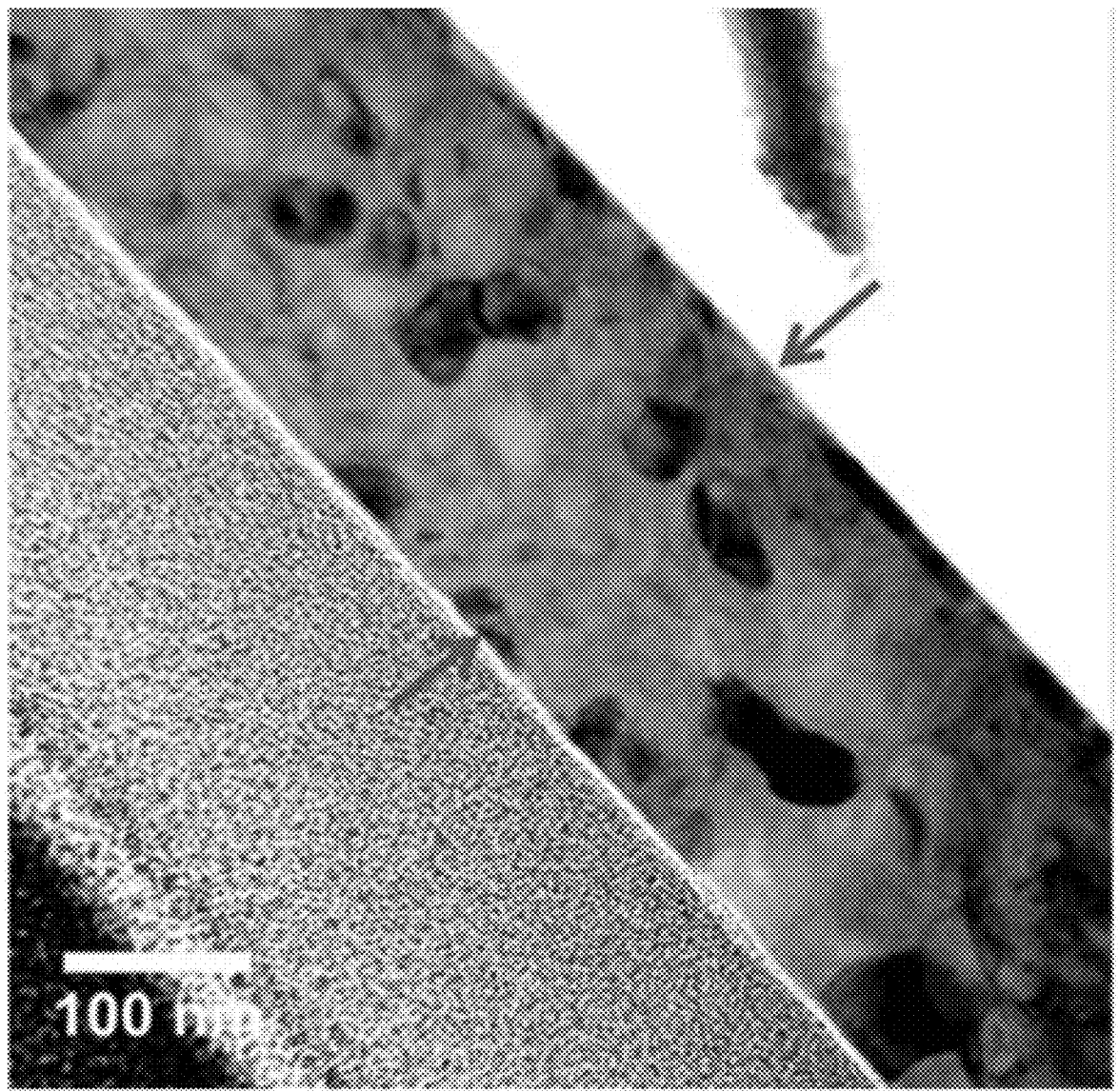
Figure 10F:
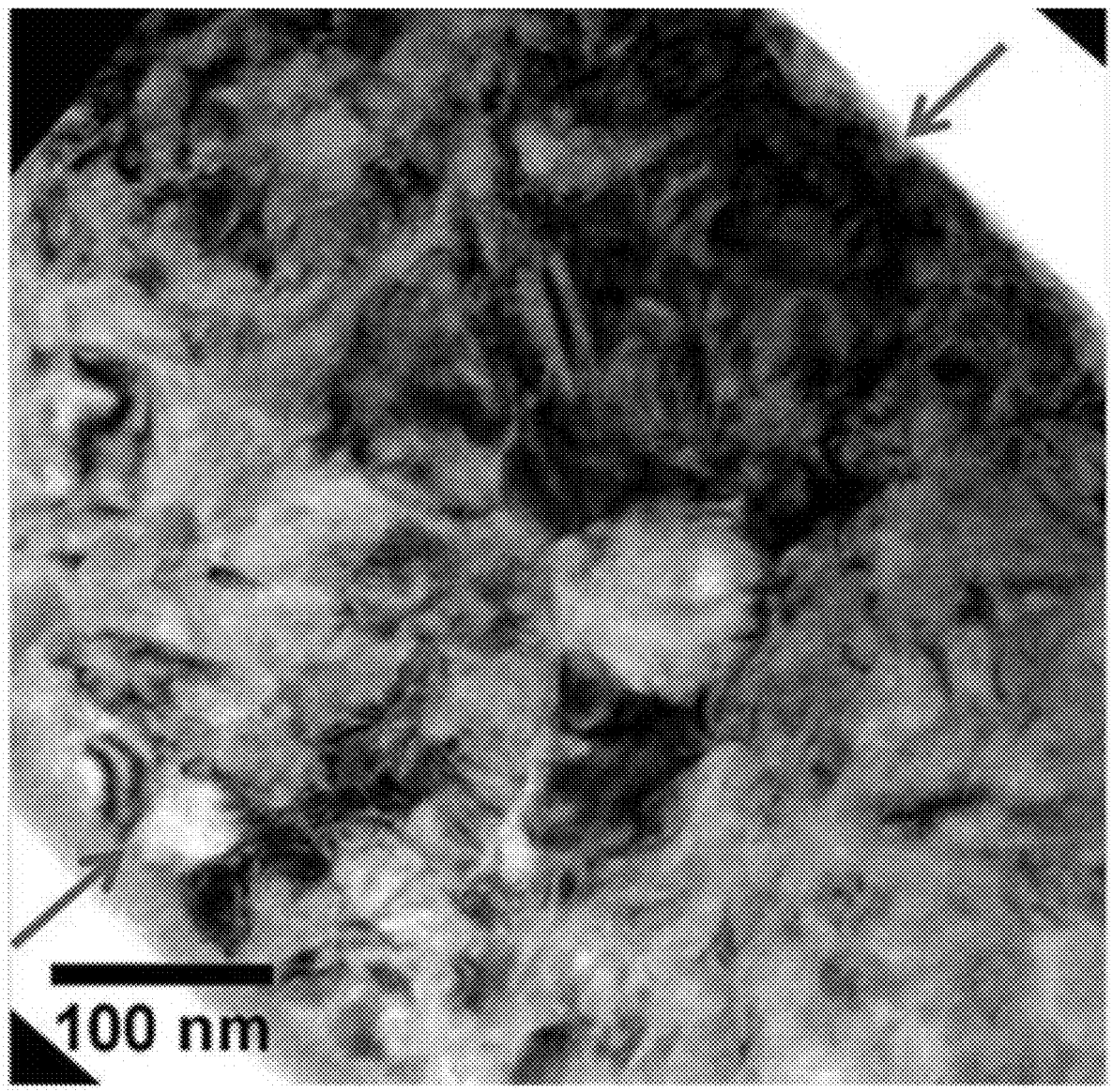

FIG. 9 illustrates exemplary evidence that by altering the average in-plane spacing (8) from FIG. 2A of a respective seed layer, a grain size $d_m$ may be systematically varied. For example, three different 100 nm thick TiAl films with a single 1 nm Ti seed layer after annealing at 600 deg C. for four hours are illustrated in FIGS. 9(a), 9(b), and 9(c). In addition to the final annealing step, the films in 9(b) and 9(c) were subjected to a 10 minute at 100 deg C. anneal process (FIG. 9(b)) and a 10 minute at 150 deg C. anneal process (FIG. 9(c)) immediately after seed layer deposition. The mean grain sizes were 65+/−35 nm, 141+/−50 nm and 176+/−65 nm, further exhibiting the controllability of grain sizes by methods 100, 500, 600 described herein.

FIG. 10 illustrates cross-sectional views of various annealed microstructures. FIG. 10 shows cross-sectional TEM bright-field images of: (a) TiAl film with a single 1 nm Ti seed layer in the middle; (b) TiAl film with four equally spaced 1 nm Ti seed layers; (c) TiAl film with smaller seed layer spacing near the top and bottom and larger spacing in the middle with a gradient microstructure formed upon annealing; (d) TiNi film with a single 1 nm Ti seed layer in the middle; (e) TiNi film with four equally spaced 1 nm Ti seed layers; (f) TiNi film with multiple seed layers and varying λ with a gradient microstructure formed after annealing, similar to (c). All the films were annealed at 650 deg C. for 4 hours. The arrows indicate the TiAl and TiNi film cross-sections. As illustrated in FIG. 9, apart from tailoring a grain diameter and grain geometry, the methods 100, 500, 600 disclosed herein enable systematic control of a size dispersion and spatial distribution of grains by varying spacing X and in-plane spacing 8 of the seed crystals.

While the principles of this disclosure have been shown in various exemplary embodiments, many modifications of structure, arrangements, proportions, the elements, materials and components, used in practice, which are particularly adapted for a specific environment and operating requirements may be used without departing from the principles and scope of this disclosure. These and other changes or modifications are intended to be included within the scope of the present disclosure and may be expressed in the following claims.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of any embodiment. In the claims, reference to an element in the singular is not intended to mean "one and only one" unless explicitly so stated, but rather "one or more."

Moreover, when language similar to "at least one of A, B, or C" or "at least one of A, B, and C" is used in the claims, the phrase is intended to mean any of the following: (1) at least one of A; (2) at least one of B; (3) at least one of C; (4) at least one of A and at least one of B; (5) at least one of B and at least one of C; (6) at least one of A and at least one of C; or (7) at least one of A, at least one of B, and at least one of C. The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

Systems, methods and apparatus are provided herein. In the detailed description herein, references to "various exemplary embodiments", "one embodiment", "an embodiment", "an exemplary embodiment", etc., indicate that the embodiment described may include a particular feature, structure, or characteristic, but every embodiment may not necessarily include the particular feature, structure, or characteristic. Moreover, such phrases are not necessarily referring to the same embodiment. The word "exemplary" is used herein to mean "serving as an example, instance or illustration". Any embodiment described as "exemplary" is not necessarily to be construed as preferred or advantageous over other embodiments and/or to exclude the incorporation of features from other embodiments. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for controlled microstructure creation, the method comprising:
    depositing a first layer of a first material in an amorphous form on a substrate;
    depositing a first plurality of seed crystals on the first layer of the first material;
    depositing a second layer of the first material to encapsulate the first plurality of seed crystals between the first layer of the first material and the second layer of the first material;
    depositing a second plurality of seed crystals on the second layer of the first material;
    depositing a third layer of the first material to encapsulate the second plurality of seed crystals;
    depositing a third plurality of seed crystals on the third layer of the first material;
    depositing a fourth layer of the first material to encapsulate the third plurality of seed crystals between the third layer of the first material and the fourth layer of the first material;
    depositing a fourth plurality of seed crystals on the fourth layer of the first material;
    depositing a fifth layer of the first material to encapsulate the fourth plurality of seed crystals between the fourth layer of the first material and the fifth layer of the first material, wherein:
        a first seed material of the first plurality of seed crystals, a second seed material of the second plurality of seed crystals, a third seed material of the third plurality of seed crystals, and a fourth seed material of the fourth plurality of seed crystals each comprise one of chromium, tungsten, iron, and titanium, and
        the first seed material, the second seed material, the third seed material, and the fourth seed material are all different materials relative to one another; and
    annealing, via an annealing step, an amorphous matrix at a temperature, the amorphous matrix formed from the first material and the first plurality of seed crystals, the second plurality of seed crystals, the third plurality of seed crystals, and the fourth plurality of seed crystals to form a microstructure.

2. The method of claim 1, wherein the depositing the first plurality of seed crystals further comprises controlling at least one condition of the depositing in order to control placement of the first plurality of seed crystals on the first layer of the first material, wherein the at least one condition comprises temperature, rate, thickness or a combination thereof.

3. The method of claim 1, wherein the depositing each of the first plurality of seed crystals, the second plurality of seed crystals, the third plurality of seed crystals, and the fourth plurality of seed crystals further comprises varying a spacing in order to systematically alter at least one characteristic of the microstructure resulting from the annealing.

4. The method of claim 3, wherein the at least one characteristic of the microstructure comprises orientation of nucleated grains, grain size, texture, phase composition of nucleated grains, or a combination thereof.

5. The method of claim 1, wherein responsive to depositing any one of the first, the second, the third, or the fourth plurality of seed crystals, a seed layer of less than 5 nm is formed.

6. The method of claim 1, wherein responsive to depositing any one of the first, the second, the third, or the fourth plurality of seed crystals, a 1 nm seed layer is formed.

7. The method of claim 1, wherein depositing any one of the first, the second, the third, or the fourth plurality of seed crystals to form a seed layer is completed at room temperature.

8. The method of claim 1, wherein the annealing step comprises the following:
   annealing the amorphous matrix at the temperature for 1 hour, the temperature being 550° C.; and
   increasing the temperature to 650° C. and holding for 30 minutes to increase a mean grain size to a range of about 20-241 nm.

9. The method of claim 1, wherein after depositing any one of the first, the second, the third, or the fourth plurality of seed crystals to form a seed layer, the seed layer is annealed at 100° C. for 10 minutes or 150° C. for 10 minutes.

10. A method of forming a tailored crystallized microstructure, the method comprising:
   forming an amorphous matrix comprising a first material and a plurality of seed crystals disposed within the first material, wherein:
      forming the amorphous matrix comprises alternating between depositing the first material and depositing the plurality of seed crystals until a desired film thickness is achieved,
      the alternating between depositing the first material and depositing the plurality of seed crystals until the desired film thickness is achieved further comprises:
         depositing a first layer of the first material;
         depositing a first set of the plurality of seed crystals on the first layer;
         depositing a second layer of the first material to encapsulate the first set of the plurality of seed crystals within the first material;
         depositing a second set of the plurality of seed crystals on the second layer;
         depositing a third layer of the first material to encapsulate the second set of the plurality of seed crystals within the first material;
         depositing a third set of the plurality of seed crystals on the third layer;
         depositing a fourth layer of the first material to encapsulate the third set of the plurality of seed crystals within the first material;
         depositing a fourth set of the plurality of seed crystals on the fourth layer of the first material; and
         depositing a fifth layer of the first material to encapsulate the fourth set of the plurality of seed crystals within the first material, wherein:
            the first set of the plurality of seed crystals are spaced apart from the second set of the plurality of seed crystals by a first distance,
            the second set of the plurality of seed crystals are spaced apart from the third set of the plurality of seed crystals by a second distance,
            the third set of the plurality of seed crystals are spaced apart from the fourth set of the plurality of seed crystals by a third distance,
            the first distance is less than the second distance,
            the third distance is less than the second distance,
            a first seed material of the first set of the plurality of seed crystals, a second seed material of the second set of the plurality of seed crystals, a third seed material of the third set of the plurality of seed crystals, and a fourth seed material of the fourth set of the plurality of seed crystals each comprise one of chromium, tungsten, iron, and titanium, and
            the first seed material, the second seed material, the third seed material, and the fourth seed material are all different materials relative to one another;
   annealing, via an annealing step, the amorphous matrix at a temperature, the temperature being less than a crystallization temperature for the first material; and
   in response to annealing the amorphous matrix at the temperature, forming the tailored crystallized microstructure.

11. The method of claim 10, wherein the depositing each of the first set of the plurality of seed crystals, the second set of the plurality of seed crystals, the third set of the plurality of seed crystals, and the fourth set of the plurality of seed crystals further comprises varying a spacing in order to systematically alter at least one characteristic of the tailored crystallized microstructure resulting from the annealing.

12. The method of claim 11, wherein the at least one characteristic of the tailored crystallized microstructure comprises orientation of nucleated grains, grain size, texture, phase composition of nucleated grains, or a combination thereof.

13. The method of claim 10, wherein the annealing step comprises the following:
   annealing the amorphous matrix at the temperature for 1 hour, the temperature being 550° C.; and
   increasing the temperature to 650° C. and holding for 30 minutes to increase a mean grain size to a range of about 20-241 nm.

* * * * *